(12) United States Patent
Bierings et al.

(10) Patent No.: US 7,767,074 B2
(45) Date of Patent: Aug. 3, 2010

(54) METHOD OF ETCHING COPPER ON CARDS

(75) Inventors: Gust Bierings, Vellinge (SE); Bjarni Bjarnason, Södra Sandby (SE); Göran Frennesson, Lund (SE); Jenny Sjöberg, Malmö (SE)

(73) Assignee: Obducat AB, Malmo (SE)

( * ) Notice: Subject to any disclaimer, the term of this patent is extended or adjusted under 35 U.S.C. 154(b) by 1459 days.

(21) Appl. No.: 10/487,745

(22) PCT Filed: Sep. 9, 2002

(86) PCT No.: PCT/SE02/01602

§ 371 (c)(1),
(2), (4) Date: Nov. 23, 2004

(87) PCT Pub. No.: WO03/024172

PCT Pub. Date: Mar. 20, 2003

(65) Prior Publication Data

US 2005/0082257 A1    Apr. 21, 2005

(30) Foreign Application Priority Data

Sep. 10, 2001 (FR) .................................. 01 02994

(51) Int. Cl.
C25F 3/04 (2006.01)
(52) U.S. Cl. ...................... 205/674; 205/640
(58) Field of Classification Search .......... 205/640–686
See application file for complete search history.

(56) References Cited

U.S. PATENT DOCUMENTS

| | | | | |
|---|---|---|---|---|
| 1,362,159 A | * | 12/1920 | Weeks | 205/666 |
| 3,129,153 A | * | 4/1964 | Margulies et al. | 205/674 |
| 3,905,883 A | * | 9/1975 | Hanazono et al. | 205/666 |
| 4,265,722 A | * | 5/1981 | Faul et al. | 205/670 |
| 4,363,708 A | * | 12/1982 | Rauchle et al. | 428/610 |

(Continued)

FOREIGN PATENT DOCUMENTS

EP    0 550 831 B1    2/1996

(Continued)

Primary Examiner—Harry D. Wilkins, III
Assistant Examiner—Nicholas A. Smith
(74) Attorney, Agent, or Firm—Renner, Otto, Boisselle & Sklar, LLP

(57) ABSTRACT

Etching of copper on a card is achieved by applying an electrical voltage between a cathode (102) and the card (42), the card (42) thereby forming an anode. The cathode (102) and the card (42) are immersed in an electrolyte comprising a first component, which may be reduced from a first state in the form of an ion having a metal atom with a first positive oxidation number to a second state in the form of an ion having said metal atom with a second positive oxidation number, which is less than said first positive oxidation number. A first redox potential in the electrolyte for reduction from the first to the second state is larger than a second redox potential in the electrolyte for reduction of divalent copper ions to metallic copper. During the etching metallic copper on the card is oxidized and transferred into positively charged copper ions while the first component is reduced from its first state to its second state. The quality of the etched structures on the card is improved since no metallic copper is precipitated on the cathode.

17 Claims, 12 Drawing Sheets

U.S. PATENT DOCUMENTS

| | | | | |
|---|---|---|---|---|
| 4,973,380 | A | * | 11/1990 | Pryor et al. .................... 216/93 |
| 5,035,778 | A | * | 7/1991 | Bindra et al. ................ 205/770 |
| 5,196,053 | A | * | 3/1993 | Dodd et al. .................... 205/85 |
| 5,302,240 | A | * | 4/1994 | Hori et al. .................... 438/719 |
| 6,143,158 | A | * | 11/2000 | Nishino et al. ............... 205/219 |
| 6,245,213 | B1 | | 6/2001 | Olsson |
| 2001/0041305 | A1 | * | 11/2001 | Sawada et al. ........... 430/278.1 |

FOREIGN PATENT DOCUMENTS

| | | |
|---|---|---|
| EP | 0 889680 A2 | 1/1999 |
| JP | 2000054167 A | 2/2000 |
| WO | WO 98/10121 | 3/1998 |

* cited by examiner

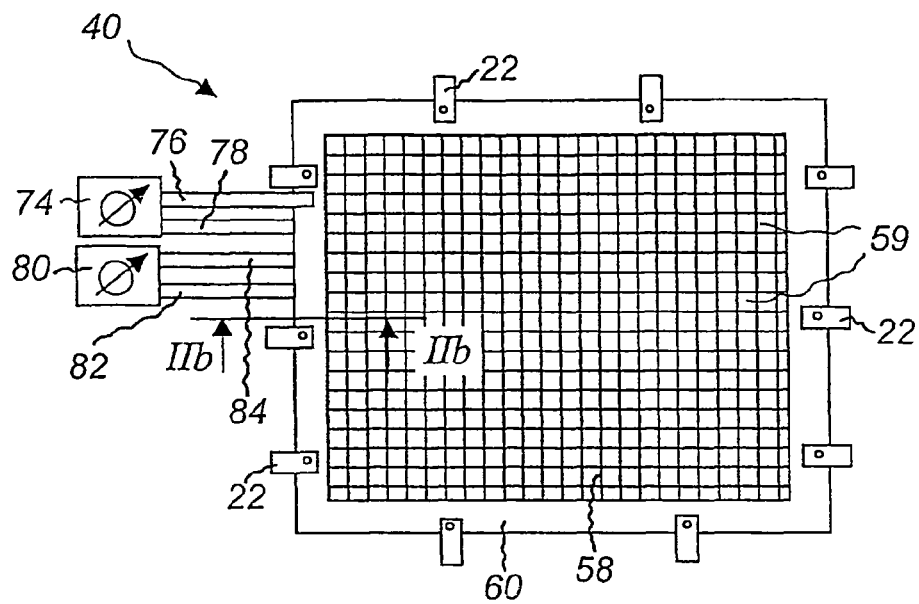
*Fig. 2a*
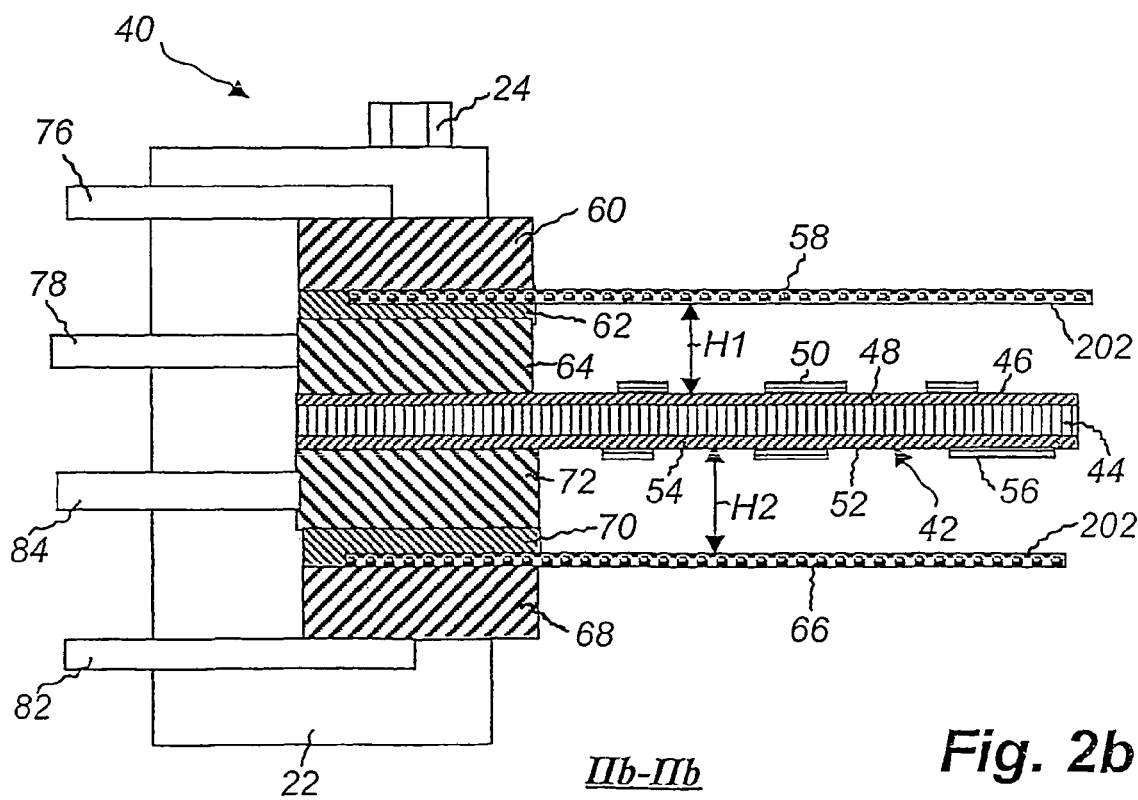
*IIb-IIb*  *Fig. 2b*

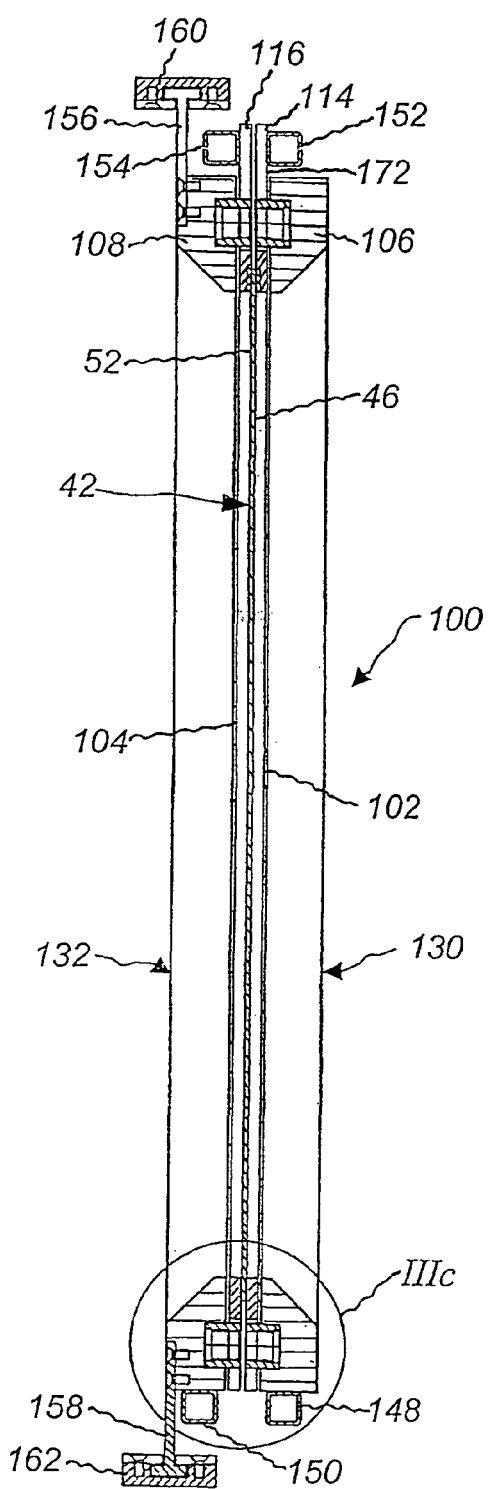
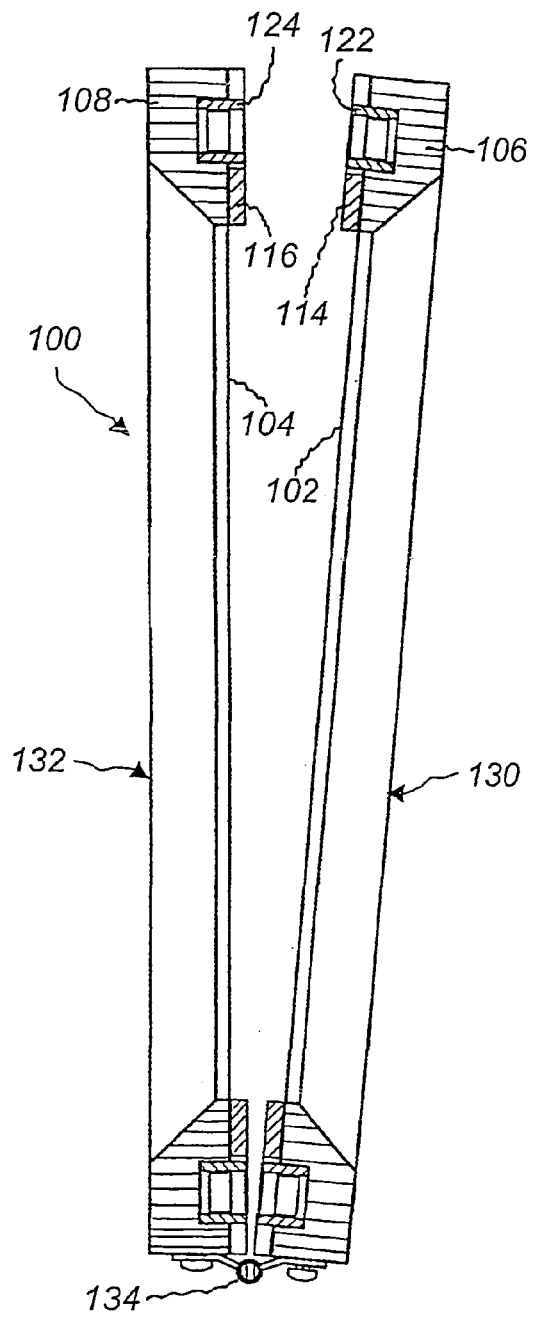
*Fig. 3b*     *Fig. 3d*

IVb-IVb

*IVf-IVf*

Vb-Vb

METHOD OF ETCHING COPPER ON CARDS

FIELD OF THE INVENTION

The present invention relates to a method of etching copper on cards or boards, in which method an electric voltage is applied between a cathode and a board, which constitutes an anode, the cathode and the board being immersed in an electrolyte.

The present invention also relates to a device for etching copper on boards, which device comprises a voltage generator, a cathode, which is arranged to be connected to the negative pole of the voltage generator, and a container, which is arranged to contain an electrolyte and, immersed in the electrolyte, the cathode and a board, which is arranged to be connected to the positive pole of the voltage generator to constitute an anode.

The invention also relates to an electrolyte for use in electrochemical etching of copper on boards, in which etching an electric voltage is applied between a cathode and a board, which constitutes an anode, the cathode and the board being immersed in the electrolyte.

BACKGROUND ART

In the manufacture of patterns, such as electric conductors, on boards, for example copper laminates intended for the manufacture of circuit boards, use is often made of etching to remove portions of an electrically conductive layer.

The board usually has a sheet of a nonconductive material, which sheet is provided with a copper layer on one or on both flat sides. Usually a photosensitive coating is applied on the copper layer. A photographic process is used to transfer a desired pattern from a master or a template to the coating, after which the portions of the coating surrounding the pattern are removed. In the etching operation, the copper layer is etched away where the coating has been removed, whereas the copper layer remains in the portions of the copper layer which are still covered by the coating. Etching is often carried out as electrochemical etching, in which a voltage is applied between a cathode and the board, which constitutes an anode, both the anode and the cathode being immersed in an electrically conductive electrolyte. This method of etching is disclosed, for example, in EP 0 889 680 and WO 98/10121. One problem of electrochemical etching is that it is necessary for the portions of the copper layer which are to be etched away to be in continuous electrical contact with the voltage source. If, during etching, a portion of the copper layer loses this electrical contact, this portion will form an "islet" which cannot be etched away. Another problem is that the copper in the copper layer which is oxidised and converted into copper ions will be reduced on the cathode and form metallic copper anew. Since this precipitation is not uniformly distributed over the surface of the cathode, the distance between the cathode and the board will vary over the flat side of the board. Owing to this, also the etching effect will vary over the flat side of the board, implying that some portions of the board are excessively etched and some portions are not sufficiently etched. To obviate these problems, the distance between the board and the cathode has to be so long that a change of this distance, due to precipitation of copper, will be insignificant in relation to its magnitude. If a long distance is provided between the cathode and the board, it is necessary to apply a high voltage between the board and the cathode to obtain the desired current density and thus a sufficient etching rate. However, if a high voltage is applied, the electric conductors do not obtain the desired dimensions. This in turn prevents the electric conductors on the board from obtaining the intended conductive and resistive properties, which makes it necessary to reject a great deal of the etched boards.

SUMMARY OF THE INVENTION

The object of the present invention is to obviate or reduce the above-mentioned disadvantages and provide a method of etching boards, said method being efficient and resulting in a low defect rate for the etched boards.

More specifically, the invention provides a method of etching copper on boards, in which method an electric voltage is applied between a cathode and a board, which constitutes an anode, the cathode and the board being immersed in an electrolyte, the method being characterised in that the electrolyte contains at least a first component, which can be reduced from a first state in the form of an ion having a metal atom with a first positive oxidation number, to a second state in the form of an ion comprising said metal atom with a second positive oxidation number, which is smaller than said first positive oxidation number, a first redox potential in the electrolyte for reduction from the first to the second state being greater than a second redox potential in the electrolyte for reduction of divalent copper ions to metallic copper, metallic copper on the board being oxidised and converted into positively charged copper ions while the first component is reduced from its first to its second state.

Another object of the present invention is to obviate or reduce the above-mentioned disadvantages and provide a device for etching boards, which device allows efficient etching of boards with a low defect rate for the etched boards.

More specifically, the invention provides a device for etching copper on boards, which device comprises a voltage generator, a cathode, which is arranged to be connected to the negative pole of the voltage generator, and a container, which is arranged to contain an electrolyte and, immersed in the electrolyte, the cathode and a board, which is arranged to be connected to the positive pole of the voltage generator to constitute an anode, said device being characterised in that the container is arranged to receive an electrolyte containing at least a first component, which can be reduced from a first state in the form of an ion having a metal atom with a first positive oxidation number, to a second state in the form of an ion comprising said metal atom with a second positive oxidation number, which is smaller than said first positive oxidation number, a first redox potential in the electrolyte for reduction from the first to the second state being greater than a second redox potential in the electrolyte for reduction of divalent copper ions to metallic copper.

It is also an object of the present invention to obviate or reduce the above-mentioned disadvantages and provide an electrolyte for etching boards, which electrolyte allows efficient etching of boards with a low defect rate for the etched boards.

More specifically, the invention provides an electrolyte for use in electrochemical etching of copper on boards, in which etching an electric voltage is applied between a cathode and a board, which constitutes an anode, the cathode and the board being immersed in the electrolyte, the electrolyte being characterised in that it contains at least a first component, which can be reduced from a first state in the form of an ion having a metal atom with a first positive oxidation number, to a second state in the form of an ion comprising said metal atom with a second positive oxidation number, which is smaller than said first positive oxidation number, a first redox potential in the electrolyte for reduction from the first to the second state being greater than a second redox potential in the electrolyte for reduction of divalent copper ions to metallic copper.

Further advantages and characteristics of the invention will appear from the description below and the appended claims.

BRIEF DESCRIPTION OF THE DRAWINGS

The invention will now be described in more detail by way of non-limiting embodiments and with reference to the accompanying drawings.

FIG. 2a is a side view showing a cassette intended for etching both flat sides of a copper laminate.

FIG. 2b shows the cassette in FIG. 2a along the line IIb-IIb.

FIG. 3b shows the cassette in FIG. 3a along the line IIIb-IIIb.

FIG. 3d shows the cassette in FIG. 3a along the line IIId-IIId and in an open position.

FIG. 3e shows an anode frame in the cassette shown in FIG. 3a.

DETAILED DESCRIPTION OF THE INVENTION

Figure 1A:
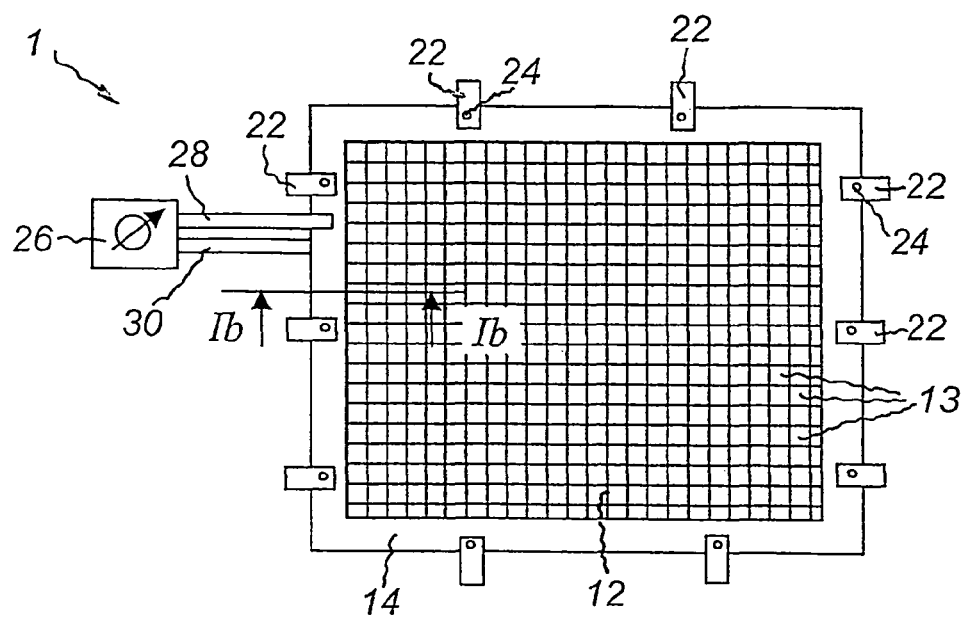
FIG. 1a is a side view showing a cassette intended for etching a flat side of a copper laminate.

In the present description and the appended claims, the term "board" refers to a sheet which has a copper layer. The board can, for example, have a substrate, such as a sheet made of polyester, epoxy plastic reinforced with fiberglass, ceramics or glass, which on one or more surfaces is provided with a copper layer. One example thereof is copper laminates, for instance reinforced sheets of epoxy plastic provided with copper layers and intended for the manufacture of circuit boards for the electronic industry. "Boards" also refers to sheets made of solid copper.

In the invention, a board provided with a copper layer is etched electrochemically. In this process, a cathode is connected to the negative pole of a voltage generator, and the copper layer of the board is connected to the positive pole of the voltage generator and thus becomes an anode. Both the cathode and the board are immersed in an electrolyte.

The electrolyte according to the invention has a certain redox potential. The redox potential is a measure of the oxidising capacity of the electrolyte and depends on the components included, the concentration of the components and the temperature of the electrolyte. If the redox potential of a certain reaction is lower than the redox potential of the electrolyte, the reaction will proceed to the left, as generally written and as used in this description. The forms of a component included in a reaction of this type are called a redox pair. When several redox pairs are present in the electrolyte, the redox pair with the highest redox potential will be reduced, i.e. the reaction will proceed to the right, whereas the redox pair with the lowest redox potential will be oxidised, i.e. the reaction will proceed to the left. Thus, the redox reaction of copper can be written as follows:

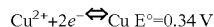

$$Cu^{2+} + 2e^- \Leftrightarrow Cu \quad E° = 0.34\,V$$

In a concentration-dependent activity of 1 for all the components included and at a temperature of 298 °K, the redox potential of a redox pair equals the standard electrode potential, E°, of the redox pair. Table values for standard electrode potentials are available for a great number of redox pairs. Standard electrode potentials are thus quite useful when estimating in what direction redox reactions will proceed. The standard electrode potential, E°, of the above reduction of copper is about 0.34 V. In the description below, use is, for practical reasons, made of standard electrode potentials when comparing the redox potentials of different redox pairs. It is important, however, to remember that in a real electrolyte it is the redox potential at the current temperature and in the current activities, and not the standard electrode potential, that determines the direction and the velocity of the reaction.

Besides water, the electrolyte also contains a first component. The first component has a first state in the form of an ion having a metal atom with a first positive oxidation number, and a second state in the form of an ion comprising said metal atom with a second positive oxidation number, which is smaller than said first positive oxidation number. Said metal atom is preferably Fe, Ce or Mn, and most preferably Fe. Said metal atom can be included in a compound ion or be an ion of said metal atom as such.

When a voltage is applied between the cathode and the anode in the form of the copper layer of the board, electrons will be removed from the anode and brought to the cathode. At the anode, an oxidation of copper takes place, in which the above-described redox reaction of copper proceeds to the left and copper ions are generated. According to the description below, there is no precipitation of copper at the cathode, owing to the nature of the electrolyte.

A first redox potential in the electrolyte for reduction of the first component from its first state to its second state is higher than a second redox potential in the electrolyte for reduction of copper according to the reaction formula above. Thus, in an electrolyte containing both copper ions and the first component, the first component will be reduced but not the copper ions. As the first component is reduced from a first state in the form of an ion having a metal atom with a first positive oxidation number, to a second state in the form of an ion comprising said metal atom with a second positive oxidation number, which is smaller than said first positive oxidation number, the reduction of the first component will not result in any precipitation on the cathode since the second state of the first component is an ion. Both the first and the second state of the first component should be ions which are relatively easy to dissolve in the electrolyte. If these ions are easy to dissolve, there is less risk of precipitation of salt on the cathode or the anode, even in case of relatively high local concentrations of ions, which may arise in the vicinity of the anode and the cathode. Suitably, the solubility of the first and the second state of the first component is at least about 0.05 mol/l in the electrolyte.

A first component which can be used in the method according to the invention is iron, Fe. Fe has a first state in the form of $Fe^{3+}$ and a second state in the form of $Fe^{2+}$. The redox reaction of this redox pair can be written as follows:

$$Fe^{3+} + 1e^- \Leftrightarrow Fe^{2+} \quad E°=0.77\ V$$

The standard electrode potential, E°, for the reduction of $Fe^{3+}$ to $Fe^{2+}$ is about 0.77 V, i.e. higher than the standard electrode potential for the reduction of $Cu^{2+}$. In an electrolyte containing both $Cu^{2+}$ and $Fe^{3+}$, $Fe^{3+}$ will be reduced on the cathode to $Fe^{2+}$, whereas $Cu^{2+}$ will remain in ion form as long as there is any $Fe^{3+}$ left in the solution. Thus, no precipitation takes place on the cathode as long as there is any $Fe^{3+}$ in the electrolyte, which makes it possible to obtain a considerably shorter and more even distance between the board and the cathode than has previously been possible.

In everyday speech, copper is considered as less precious than the so-called red forms which are included in redox pairs having a higher standard electrode potential than the above-mentioned 0.34 V. When two redox pairs are mixed in an electrolyte, the direction of the reaction of the redox pair with the higher redox potential will proceed to the right and the redox reaction of the redox pair with the lower redox potential will proceed to the left. When metallic copper, Cu, is immersed in an electrolyte containing the first component in its first state, the first component will be reduced from its first state to its second state while copper is oxidised to copper ions, $Cu^{2+}$, since the first redox potential for reduction of the first component from its first state to its second state is greater than the second redox potential for reduction of copper ions to metallic copper. Thus, the first component will etch copper chemically on the copper layer of the board. This chemical etching is independent of the electric voltage. As a result, the first component helps to etch "islets", i.e. portions on the copper layer which are to be etched away but have lost electrical contact with the positive pole of the voltage generator. This increases the amount of high-quality boards and allows etching of more complicated structures on the board. Using Fe as the first component, the chemical etching of copper on the copper layer of the board proceeds according to the following simplified reaction:

$$Cu + 2Fe^{3+} \Rightarrow Cu^{2+} + 2Fe^{2+}$$

According to the invention, use is thus made of simultaneous chemical and electrochemical etching, in which a first component is used, which prevents precipitation on the cathode and which can etch copper chemically on the copper layer of the board. Another advantage is that if any copper, contrary to expectation, should be precipitated on the cathode, the first component will chemically etch also this copper, thus keeping the cathode clean from precipitation.

Many other compounds can act as a first component. Examples of such first components are manganese, Mn, and cerium, Ce. The redox reactions for reduction of these first components from their first states to their second states have the following formulas and standard electrode potentials, E°:

$$Mn^{3+} + e^- \Leftrightarrow Mn^{2+} \quad E°=\text{about } 1.5\ V$$

$$Ce^{4+} + e^- \Leftrightarrow Ce^{3+} \quad E°=\text{about } 1.7\ V$$

Besides Fe, Mn and Ce which are mentioned above, also inorganic and organic complexes of these substances as well as a plurality of other substances are suitable to use as a first component. Furthermore, a number of different compound ions can be employed. Examples of such first components and their redox reactions are:

$$MnO_4^- + 8H^+ + 5e^- \Leftrightarrow Mn^{2+} + 4H_2O \quad E°=1.51\ V$$

$$Cr_2O_7^{2-} + 14H^+ + 6e^- \Leftrightarrow 2Cr^{3+} + 7H_2O \quad E°=1.33\ V$$

In the above examples, it is thus a metal atom, namely Mn or Cr, included in the ion, that is converted in the reduction from a first positive oxidation number to a second positive oxidation number, which is smaller than said first positive oxidation number.

By studying tables of standard electrode potentials of redox pairs, it is possible to find +more compounds which can be used as a first component. Examples of organic complexes are ferric bipyridines, $[Fe(bipy)_2]^{3+}$ and $[Fe(bipy)_3]^{3+}$:

$$[Fe(bipy)_2]^{3+} + e^- \Leftrightarrow [Fe(bipy)_2]^{2+} \quad E°=0.78\ V$$

$$[Fe(bipy)_3]^{3+} + e^- \Leftrightarrow [Fe(bipy)_3]^{2+} \quad E°=1.03\ V$$

Preferably, the first component is not injurious, or is only moderately injurious, to the health and/or the environment in its first and its second state. The first component is also preferably commercially available at a low cost.

The etching according to the invention is both electrochemical and chemical. Preferably, most of the etching is electrochemical since this reduces the under etching. Approximately about 70-90%, preferably about 80%, of the copper that is removed from the copper layer of the board should be removed by electrochemical etching, the remaining about 30-10%, preferably about 20%, of the copper being removed by chemical etching. Therefore, the chemically etching effect of the electrolyte should not be unnecessarily powerful. The chemical etching rate is defined as the thickness reduction per time unit of a copper layer which is etched chemically. It has been found that the chemical etching rate, i.e. the capacity of the electrolyte to etch the copper layer in the absence of an applied voltage, should be about 6-100 nm/s, preferably about 10-70 nm/s. The desired chemical etching rate depends on the size of the electric conductors which are to be made on the board. When etching boards with electric conductors having a width of about 50 μm, the thickness of the copper layer usually being about 18-35 μm or less, a lower chemical etching rate is usually preferred, such as 10-50 nm/s, more preferably about 30 nm/s. In electric conductors having a width of about 20 μm, an electrolyte with an even lower chemical etching rate, such as 10-20 nm/s should be used.

The concentration of the first component is suitably about 0.02-0.7 mol/l, preferably about 0.05-0.5 mol/l. The concentration must be selected in consideration of the redox potential for reduction of the first component from its first to its second state and the desired chemical etching effect. It has thus been found that, when the first component is in the form of Fe, it is convenient to use a concentration of about 0.1-0.5 mol/l $Fe^{3+}$. When etching small structures, such as the above-mentioned electric conductors with a width of 50 μm and even thinner conductors, the concentration of Fe can suitably be about 0.05-0.3 mol/l $Fe^{3+}$.

The greater the difference between the first redox potential in the electrolyte for reduction of the first component from its first to its second state and the second redox potential in the electrolyte for reduction of divalent copper ions to metallic copper, the lower the concentration of the first component should be for the chemical etching rate not to be excessively high. Thus, when using Ce, the concentration of $Ce^{4+}$ should be much lower than the concentration of $Fe^{3+}$ when using Fe. In case of a lower concentration of the first component, the number of ions moving in the electrolyte will decrease. This results in polarisation, which means that there is a shortage of positively charged ions at the cathode and a shortage of negatively charged ions at the anode. A high degree of polarisation necessitates an increase in the applied voltage to provide sufficient current density and thus a sufficient etching rate. However, when increasing the voltage, the above-mentioned problems concerning the dimensions of the conductors will occur.

Preferably, the first redox potential should be less than about 1.0 V, but more than about 0.4 V, to provide a suitable chemical etching rate. In this context, a particularly preferred component is Fe. The redox potential for the reduction of $Fe^{3+}$ to $Fe^{2+}$ at the current temperatures and concentrations is relatively low. Consequently, it is possible to maintain a relatively high concentration of $Fe^{3+}$, which reduces the polarisation, without an excessive increase in the etching effect. $Fe^{3+}$ is a small ion which is mobile and takes up electrons efficiently from the cathode, thus reducing the polarisation.

In some cases, it may be interesting to use two different first components. When using a first component, such as Ce, which is highly oxidising in its first state, for example $Ce^{4+}$ in the case of Ce, it may sometimes be convenient to add one more first component, such as Fe. Fe can be added in the form of $Fe^{3+}$ or $Fe^{2+}$. The chemically etching effect of $Fe^{3+}$ in the presence of $Ce^{4+}$ is very limited. However, because of its charge and the fact that it can be added in higher concentrations than $Ce^{4+}$ without causing an excessively high redox potential in the electrolyte, $Fe^{3+}$ will reduce the polarisation in the electrolyte. As a result, the voltage can be reduced at a given desirable current density in the electrolyte, which reduces the underetching.

It is often suitable to add a second component to the electrolyte together with the first component. The second component can be reduced from a first state in the form of an ion having an atom with a first positive oxidation number, to a second state in the form of an ion comprising said atom with a second positive oxidation number, which is lower than said first positive oxidation number, a third redox potential in the electrolyte for reduction of the second component from its first state to its second state being lower than the second redox potential in the electrolyte for reduction of divalent copper ions to metallic copper. Thus, the second component cannot etch copper. On the other hand, the second component has a positive effect on the migration of ions in the electrolyte. As a result, the second component reduces the polarisation in the electrolyte, which makes it possible to provide the desired current density at a lower voltage, thus reducing the underetching. Suitable second components are those that are mobile in the electrolyte and efficiently reduce the polarisation. The second component should thus have a high electric charge, a small size and should not associate with water or precipitate. Preferably, the second component is Sn. Sn can be present as $Sn^{4+}$, which can be reduced to $Sn^{2+}$ according to the following redox reaction:

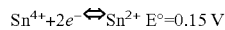

$$Sn^{4+} + 2e^- \Leftrightarrow Sn^{2+} \quad E° = 0.15\ V$$

The second component can thus take up electrons on the cathode and be reduced. However, these electrons will be given, in the bulk of electrolyte, to the first component, which is then reduced from its first to its second state, while the second component is oxidised to its first state. Consequently, the second component seems to act as an electron carrier. Since the third redox potential for converting the second component from its first to its second state is lower than the second redox potential for reduction of copper ions to metallic copper, there is no risk of precipitation of the second component since both copper ions and the first state of the first component will oxidise the second state of the second component, which then converts to the first state. Naturally, a third state of the second component, which state can be uncharged or constitute a positively charged ion having a lower charge than the second state of the second component, will also be oxidised by both copper ions and the first state of the first component.

The concentration of the second component is suitably about 0.005-0.4 mol/l, preferably about 0.05-0.2 mol/l, and more preferably about 0.1 mol/l.

The solubility of $Sn^{2+}$ is limited in the electrolyte, which means that the concentration of $Sn^{2+}$ has to be kept very low. It has, however, been found that an addition of hydrogen fluoride, HF, to the electrolyte increases the solubility of Sn in such a manner that an amount of Sn suitable for reducing the polarisation can be present in the electrolyte without any precipitation of Sn, for example in the form of $SnO_2$. The reason for this is that $SnF_4$ is very easily dissolvable. It has been found that the electrolyte suitably has a concentration of about 0.01-0.5 mol/l $F^-$. It has been found that in an electrolyte containing HF, according to that described above, it is suitable to use a concentration of Sn of about 0.005-0.4 mol/l. An addition of HF reduces the pH, which increases the solubility of many ions, $Fe^{3+}$ among others. Another advantage of HF is that small and mobile ions in the form of $H^+$ and $F^-$ are added to the electrolyte, which reduces the polarisation.

It has also been found that an addition of HF has a polarisation-reducing effect, even when no Sn is present in the electrolyte. This means that fluoride ions, $F^-$, can be added to the electrolyte, for example in the form of HF or NaF, to reduce the polarisation, irrespective of whether Sn is present in the electrolyte or not.

The electrolyte has to contain negatively charged ions, which are counter ions of the positively charged ions in the electrolyte. These negatively charged ions should have good solubility for the copper ions present in the electrolyte as well as for the positively charged ions of the first component and, if present, the second component. To avoid precipitation, solubility limits for salts, etc, of ions contained in the electrolyte should not be exceeded.

Furthermore, the negatively charged ions should not cause any generation of gas during the electrochemical etching, nor should they etch the copper. Examples of suitable counter ions are sulphate ions, $SO_4^{2-}$, and fluoride ions, $F^-$, which both have good solubility for copper ions and iron ions. In particular $F^-$ is a very small and mobile ion, which thereby helps reducing the polarisation in the electrolyte during etching. In some cases, the chloride ion, $Cl^-$, is a less suitable counterion, as it tends to cause uneven etching and pitting, i.e. undesirable pit erosion in metal objects, for example electric conductors, wires and the like, immersed in the electrolyte.

It has, however, surprisingly been found that if fluoride ions, $F^-$, are present in the electrolyte, the quality of the etched structures, for example the electric conductors, can be improved by adding also chloride ions, $Cl^-$, to the electrolyte. It is particularly preferred for the electrolyte to contain both $F^-$, $Sn^{4+}$ and $Cl^-$. A suitable concentration of chloride ions, $Cl^-$, in an electrolyte, to which also HF has been added, is 0.03-1.5 mol/l, preferably 0.1-0.5 mol/l. The chloride ions, $Cl^-$, can, for example, be added to the electrolyte in the form of NaCl or hydrochloric acid, HCl.

In some cases, it may be suitable to add more compounds to further reduce the polarisation without etching the copper layer. Examples of such suitable compounds are $Cu(BF_4)_2$, $Sn(BF_4)_2$ and $HBF_4$. These compounds can suitably be added to the electrolyte in a concentration of about 0.05-0.4 mol/l.

A fourth redox potential in the electrolyte for reduction of the first component from said second state to a third state is lower than said second redox potential. As a result, the second state of the first component cannot etch copper chemically by reduction to the third state of the first component, which is advantageous since the chemically etching effect should not, as already mentioned, be excessively high. If the third state of the first component is an uncharged form, it is an advantage, should any precipitation occur on the cathode, if it is a precipitation of copper and not of the first component, which is kept in the solution. It is also preferable for said fourth redox potential to be lower than the redox potential for the generation of hydrogen gas. If the electrolyte has been unintentionally depleted of the first component in its first state and of copper ions, hydrogen gas generation will prevent precipitation of the first component on the cathode. Redox potentials for reduction of the first components mentioned above from their second to their third state as well as the redox potential for hydrogen gas generation can thus be written as follows:

$$Fe^{2+}+2e^- \Leftrightarrow Fe \quad E°=-0.44\ V$$

$$Ce^{3+}+3e^- \Leftrightarrow Ce \quad E°=-2.3\ V$$

$$Mn^{2+}+2e^- \Leftrightarrow Mn \quad E°=-1.2\ V$$

$$2H^++2e^- \Leftrightarrow H_2 \quad E°=0.0\ V$$

Thus, neither $Fe^{2+}$, $Ce^{3+}$ nor $Mn2+$ can etch copper on the board, and there will be no precipitation of Fe, Ce or Mn on the cathode.

The pH of the electrolyte should preferably be about −0.5 to 4, and more preferably about 0 to 2. A lower pH improves the solubility of the components included and reduces the polarisation owing to the increased concentration of the mobile hydrogen ions. The pH can, for example, be adjusted by means of sulphuric acid, $H_2SO_4$. The temperature of the electrolyte is usually set at about 20-50° C. When etching small structures on the board, such as electric conductors having a width of about 50 μm and less, the temperature should suitably be about 20-35° C., preferably about 30° C. When etching larger structures, the temperature can suitably be higher, such as 35-50° C., since a higher temperature increases the chemical etching rate.

In a method of etching a board, the board and a cathode are immersed in an electrolyte of the kind described above. The copper layer on a flat side of a board is connected to the positive pole of a voltage generator so as to constitute an anode and the cathode is connected to the negative pole of the voltage generator. A voltage of about 0.5-6 V, preferably about 1-3 V, is then applied between the copper layer and the cathode, the board being etched electrolytically as well as chemically while measuring the electric current. When after a certain period of time the electric current decreases, which indicates that a great deal of the copper layer has been etched away, the voltage generator is turned off. As an alternative, the etching takes place at a constant electric current while measuring the voltage, the electric current being turned off as the potential rises. The board is then allowed to remain still longer in the electrolyte, while final etching in the form of a purely chemical etching takes place.

According to a preferred method, a flow of electrolyte is removed, preferably continuously, from the container in which the board and the cathode are immersed in the electrolyte. The flow which has been removed is conducted to a regeneration tank. In the regeneration tank, a regenerant is added, which can oxidise the first component from its second to its first state. The regenerant thus has a fifth redox potential for reduction which is greater than the first redox potential for reduction of the first component from its first state to its second state. One example of a suitable regenerant is sodium persulphate, $Na_2S_2O_8$. The redox reaction of the persulphate ion in $Na_2S_2O_8$ is as follows:

$$S_2O_8^{2-}+2e^- \Leftrightarrow 2SO_4^{2-} \quad E°=2.01\ V$$

In the contact with a first component, whose first redox potential is lower than the above-mentioned fifth redox potential, $S_2O_8^{2-}$ will thus be reduced while the first component is oxidised from its second to its first state. If the first component is Fe, the following reaction will take place:

$$2Fe^{2+}+S_2O_8^{2-} \Rightarrow 2Fe^{3+}+2SO_4^{2-}$$

When the first component has been converted from its second to its first state, the regenerated electrolyte is pumped back to the container, in which the board and the cathode are immersed in electrolyte. The regeneration of the electrolyte can also be carried out batchwise, either in a special regeneration tank or in the container intended to contain the board and the cathode.

As mentioned above, said fifth redox potential for reduction of $S_2O_8^{2-}$ is so high that $S_2O_8^{2-}$ is able to oxidise also $Mn^{2+}$ to $Mn^{3+}$ and $Ce^{3+}$ to $Ce^{4+}$. It will be understood that, in principle, $S_2O_8^{2-}$ can be used as a first component when etching the copper layer of the board. In most cases, however, $S_2O_8^{2-}$ yields too high a chemical etching effect to be useful as a first component. Nor is it possible to regenerate $S_2O_8^{2-}$ in a simple way.

In the reduction of $S_2O_8^{2-}$, two sulphate ions, $S_4^{2-}$, are formed. This is an advantage since these sulphate ions can act as counter ions to the copper ions generated in the etching of the copper layer of the board. Copper sulphate has a high solubility and therefore a certain amount of electrolyte can be used for a relatively long period of time before the concentration of copper sulphate gets too high. Some of the electrolyte is suitably continuously drained so as to keep the copper sulphate content below the solubility limit, while water and the first and second components in the electrolyte are added to compensate for the drained electrolyte. Since the copper sulphate content is normally higher locally at the surface of the board, where precipitation of copper sulphate would be injurious, it is often suitable not to allow the copper ion content in the bulk of electrolyte to exceed about 1 mol/l.

The first and the second component can be added in the form of salts containing the first and the second components in their first or second state. For example, Fe can be added in the form of $Fe^{3+}$ as $Fe_2(SO_4)_3$ or in the form of $Fe^{2+}$ as $FeSO_4$. In the latter case, $FeSO_4$ is suitably added to the regeneration container and treated with a regenerant, such as $Na_2S_2O_8$, for converting $Fe^{2+}$ to $Fe^{3+}$, which is subsequently used in etching. Thus, $FeSO_4$ functions as a precursor to the formation of $Fe^{3+}$.

Samples of the electrolyte are taken and analysed as to the content of the first component in its first state. When Fe is used as the first component, the $Fe^{2+}$ content can be analysed by titration with permanganate ions. From this analysed $Fe^{2+}$ content and from the known, original $Fe^{3+}$ content, the current amount of $Fe^{3+}$ can be calculated. In this way, it is ensured that a sufficient concentration of the first component in its first state is always available in the container in which the board is etched. A sufficient concentration of the first component in its first state is necessary in order to avoid precipitation of copper on the cathode and to provide the desired chemical etching effect. Excess use of regenerant should, however, be avoided, since this can cause a chemical etching effect that is unnecessarily powerful. The addition of regenerant to the regeneration tank is controlled on the basis of the analysis of the content of the first component in its first state. It is also possible to introduce automatic sampling and/or control of the addition of regenerant.

The applied voltage during etching is selected according to the structure that is to be etched, the nature of the electrolyte and the distance between the cathode and the board. In small structures, such as electric conductors with a width of 50 μm and less, use is advantageously made of a low voltage, such as a voltage of 0.5-3 V, since the effects of under etching are more significant in thin conductors. In addition, the closer the copper layer of the board is located to the cathode, the lower voltage is needed for a certain etching rate. It is thus an advantage for the distance between the cathode and the board to be kept as short as possible, in particular when small structures are being etched. According to the invention, precipitation on the cathode is avoided, and the distance between the cathode and the board can be kept small and even over the flat side of the board during the entire etching process. It is, however, also possible, when etching very large boards, to increase the distance between the cathode and the board. The reduced polarisation provided by the electrolyte makes it possible to increase the distance between the cathode and the board compared to prior art technique, while using the same voltage and current density. As a result, the degree of sensitivity to irregularities in the board and the cathode is reduced in such large boards without an increase in the underetching.

EXAMPLE 1

A plurality of electrolyte mixtures were prepared of water and the compounds described below. In all cases but one, use was made of 100 g salt per liter of water. A cathode and an anode were immersed in the electrolyte at a distance of 1 cm from each other and a voltage of 2.0 V was applied between the cathode and the anode. The anode had the form of a circular surface with a diameter of 2 cm. Table 1 shows the electric current that was measured in the different electrolyte mixtures.

TABLE 1

Currents measured in different electrolyte mixtures.

| Compounds added to water | Current (A) |
|---|---|
| $FeSO_4$ | 0.09 |
| $Fe_2(SO_4)_3$ | 0.23 |
| $CuSO_4$ | 0.17 |
| $Na_2S_2O_8$ | 0.26 |
| $CuSO_4 + Fe_2(SO_4)_3 + Sn(SO_4)_2 + HF$ * | 0.40 |

* This electrolyte mixture contained 20 g CuSO4, 80 g Fe2(SO4)3, 8 g Sn(SO4)2 and 15 g HF per litre of water.

As appears from Table 1, an electrolyte containing $Cu^{2+}$, $Fe^{3+}$, $Sn^{4+}$ and HF provides significantly higher current and thus lower polarisation than an electrolyte containing copper ions only.

EXAMPLE 2

A board in the form of a copper laminate intended for the manufacture of circuit boards had a size of 2.5×2.5 cm. The copper laminate had on a flat side a copper layer with a thickness of 18 μm, on which a photo sensitive coating was applied. A photographic process was used to transfer a pattern from a master to the coating. The pattern included 50 μm lines/gaps, i.e. lines, for example electric conductors, and gaps with a width of about 50 μm. An electrolyte was prepared by dissolving $Fe_2(SO_4)_3$ and $CuSO_4$ in water to a concentration of 0.25 mol/l $Fe^{3+}$ and 0.05 mol/l $Cu^{2+}$. The pH of the electrolyte was adjusted by means of sulphuric acid to pH=0.6. The copper laminate and a sheet-like cathode were then placed in a container holding said electrolyte. A voltage of 2 V was applied between the copper laminate and the cathode, and the current intensity was measured to about 2 A. The amount of $Fe^{3+}$ in the electrolyte corresponded to a great excess in relation to the amount of copper that was to be etched, which made regeneration unnecessary during the etching process. The distance between the flat side of the copper laminate and the flat-side of the cathode facing the board was 8 mm. The temperature of the electrolyte was 35° C. The board was etched in this manner for about 100 s. As the current began to drop, the voltage was turned off, and the copper laminate was washed to remove the electrolyte and the remaining coating.

When examining the flat side of the cathode facing the copper laminate, no precipitation of copper or any other substances was found. When examining the copper layer of the copper laminate under a microscope, it was found that the sides of the lines which had been etched on the copper laminate were somewhat frayed. No traces of "islets" of copper could be found on the copper laminate.

EXAMPLE 3

A copper laminate was etched under the same experimental conditions as in Example 2, except that NaCl was added to the electrolyte in such an amount that the concentration of $Cl^-$ was 0.25 mol/l.

No precipitation was observed on the cathode. When examining the etched copper laminate under a microscope, it was found that the sides of the lines that had been etched were to a large extent frayed and in some places the lines were completely broken. Traces of "islets" of copper could also be observed on the copper laminate. An addition of chloride ions thus seems to deteriorate the etching result.

EXAMPLE 4

A copper laminate was etched under the same experimental conditions as in Example 2, except that NaCl in such an amount that the concentration of $Cl^-$ was 0.25 mol/l and HF in such an amount that the concentration of $F^-$ was about 0.05 mol/l were also added to the electrolyte.

No precipitation was observed on the cathode. When examining the copper layer of the copper laminate under a microscope, it was found that the sides of the lines that had been etched on the copper laminate were quite smooth. The lines were not broken and no "islets" of copper could be found. The upper sides of the lines, however, showed signs of underetching, i.e. the electrolyte had etched copper under the coating. Accordingly, an addition of chloride ions and fluoride ions to the electrolyte improves the etching result.

EXAMPLE 5

A copper laminate was etched under the same experimental conditions as in Example 4, except that $Sn^{4+}$ in a concentration of about 0.07 mol/l and $(BF_4)^-$ in a concentration of about 0.14 mol/l were also added to the electrolyte.

No precipitation was observed on the cathode. When examining the copper layer of the copper laminate under a microscope, it was found that the sides of the lines that had been etched on the copper laminate were quite smooth. The lines were not broken and no "islets" of copper could be found. The upper sides of the lines showed limited signs of under etching and had a very high quality. Accordingly, the electrolyte used in Example 5 yields an excellent etching result.

DESCRIPTION OF PREFERRED EMBODIMENTS

Figure 1B:
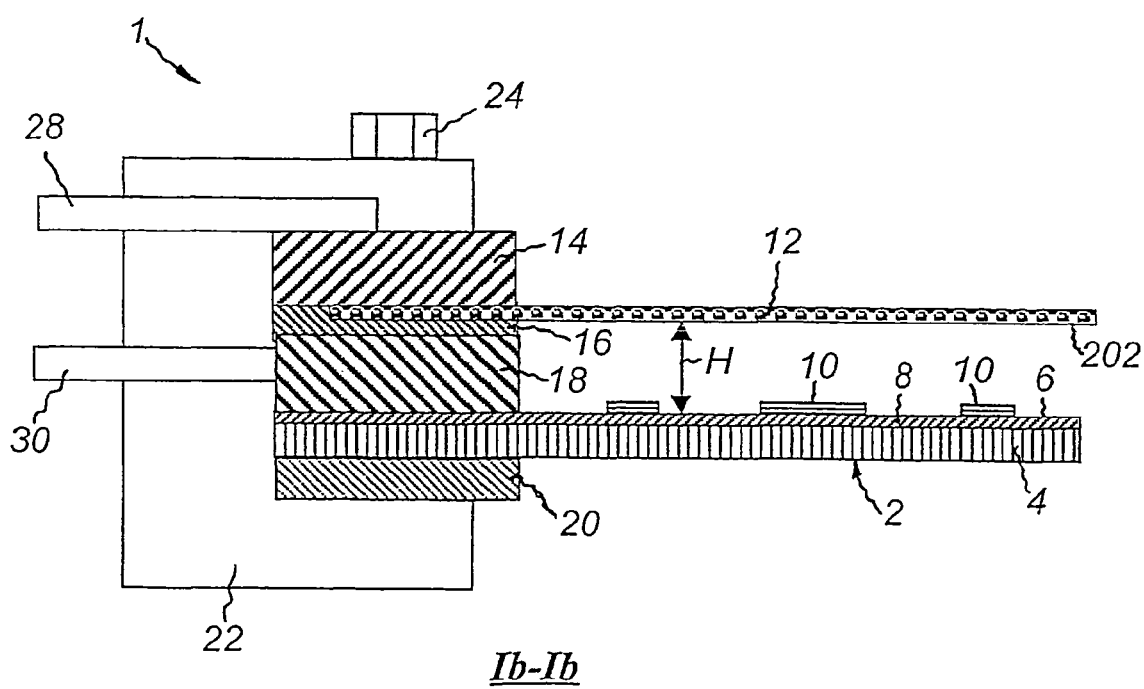
FIG. 1b shows the cassette in FIG. 1a along the line Ib-Ib.

FIGS. 1a and 1b show a cassette 1 for a board in the form of a copper laminate 2 to manufacture a circuit board. The copper laminate 2 has an electrically non-conductive base 4 made of polyester. On a flat side 6, the copper laminate 2 is provided with a copper layer 8, which has a thickness of about 35 μm. The portions of the copper layer 8 which are to constitute electric conductors on the finished circuit board are coated with a thin coating in the form of a thin resist layer 10, which protects these portions of the copper layer 8 during etching. The cassette 1 has a cathode 12 in the form of electrically conductive metal netting made of acid-proof steel, such as SS 2343, which cathode 12 is welded on a cathode frame 14, which is made of a sectional element of acid-proof steel, in such a manner that the cathode frame 14 has good electrical contact with the cathode 12. An insulator 16 in the form of a layer of electrically insulating epoxy adhesive reinforces the attachment of the cathode 12 to the cathode frame 14, protects the netting, prevents the weld joint from being etched and insulates the cathode 12 from an anode frame 18, which is made of a sectional element of acid-proof-proof steel. The anode frame 18 is pressed against the copper layer 8 of the copper laminate 2 so as to have good electrical contact with the copper layer 8. A support frame 20 is pressed against the base 4 of the copper laminate 2. A plurality of clamps 22, which are tightened by means of screws 24 and are made of an electrically insulating material, such as PEEK (polyetheretherketone plastic), which combines very high hardness with good electrically insulating properties, press the support frame 20, and thus the copper laminate 2, against the anode frame 18, the insulator 16, the cathode 12 and the cathode frame 14. Both the insulator 16 and the anode frame 18 have a well-defined thickness, which makes the distance H between the copper layer 8 of the copper laminate 2 and the cathode 12 constant over the entire surface of the flat side 6 of the copper laminate 2.

A voltage generator 26 supplies a cathode line 28 with negative voltage and an anode line 30 with positive voltage. The cathode line 28 provides the cathode frame 14, and thus the cathode 12, with negative voltage. The anode line 30 provides the anode frame 18, and thus the copper layer 8 of the copper laminate 2, with positive voltage.

FIGS. 2a and 2b show a cassette 40 for etching a board in the form of a copper laminate 42 to manufacture a circuit board The copper laminate 42 has an electrically non-conductive base 44 made of polyester. On a first flat side 46, the copper laminate 42 has a copper layer 48 with a thickness of about 35 μm. The portions of the copper layer 48 which are to constitute electric conductors on the finished circuit board are coated with a thin resist layer 50. On its second flat side 52, the copper laminate 42 has a copper layer 54 with a thickness of about 35 μm. The portions of the copper layer 54 which are to constitute electric conductors on the finished circuit board are coated with a thin resist layer 56. The cassette 40 has a first cathode 58, which is of the same kind as the cathode 12. The first cathode 58 is welded on a first cathode frame 60, which is of the kind described above in connection with the cathode frame 14. A first insulator 62 in the form of a layer of electrically insulating epoxy adhesive reinforces the attachment of the first cathode 58 to the first cathode frame 60, protects the weld joint and insulates the first cathode 58 from a first anode frame 64, which is made of a sectional element of acid proof steel. The first anode frame 64 is pressed against the copper layer 48 on the first flat side 46 of the copper laminate 42 so as to have good electrical contact with the copper layer 48. The cassette 40 also has a second cathode 66, which is of the same kind as the cathode 12. The second cathode 66 is welded on a second cathode frame 68, which is of the kind described above in connection with the cathode frame 14. A second insulator 70 in the form of a layer of electrically insulating epoxy adhesive reinforces the attachment of the second cathode 66 to the second cathode frame 68, protects the weld joint and insulates the second cathode 66 from a second anode frame 72, which is made of a sectional element of acid proof steel. The second anode frame 72 is pressed against the copper layer 54 on the second flat side 52 of the copper laminate 42 in such a manner that the anode frame 72 has good electrical contact with the copper layer 54. A plurality of clamps 22 of the above-described kind press the cathode frames 60, 68, the cathodes 58, 66, the insulators 62, 70 and the anode frames 64, 72 against the copper laminate 42. The insulators 62, 70 and the anode frames 64, 72 have a well defined thickness, which makes the distance H1 between the copper layer 48 and the first cathode 58 and the distance H2 between the copper layer 54 and the second cathode 66 constant over the entire surface of the flat sides 46 and 52, respectively, of the copper laminate 42. However, H1 and H2 need not be the same distance but can be adjusted individually depending on the desired etching of the respective flat sides 46, 52.

A first voltage generator 74 supplies a first cathode line 76 with negative voltage and a first anode line 78 with positive voltage. A second voltage generator 80 supplies a second cathode line 82 with negative voltage and a second anode line 84 with positive voltage. The cathode lines 76, 82 supply the respective cathode frames 60, 68, and thus the respective cathodes 58, 66, with negative voltage. The anode lines 78, 84 supply the respective anode frames 64, 72, and thus the respective copper layers 48, 54 of the copper laminate 42, with positive voltage. The two voltage generators 74, 80 can feed either the same voltage or a voltage that is individually adjusted to the etching of the respective copper layers 48, 54. Also the time of interrupting the etching can be individually adjusted for the respective voltage generators 74, 80. If it is desirable to have the same voltage and time setting, one voltage generator only can feed negative voltage to both the cathode lines 76, 82 and positive voltage to both the anode lines 78, 84.

FIGS. 3a-3e show another embodiment of a cassette 100 for etching the flat sides 46 and 52 of a copper laminate 42 of the type shown in FIG. 2b. The cassette 100 has a first cathode 102 and a second cathode 104 in the form of metal netting, which have been attached in the above-described manner to a first and a second cathode frame 106 and 108, respectively. The cathodes 102, 104 are fixed in the respective cathode frames 106, 108, which means that the surface of the cathodes 102, 104 is quite smooth and precise distances can be obtained in the cassette 100 between the respective cathodes 102, 104 and the respective flat sides 46, 52. A first and a second glue thread 110 and 112, respectively, of electrically non-conductive epoxy adhesive insulate the cathode 102 and 104, respectively, and the cathode frame 106 and 108, respectively, from a first and a second anode frame 114 and 116, respectively. The glue threads 110, 112 also protect the cathodes 102, 104 and the weld joints against etching. Each cathode frame 106, 108 has a groove 118 and 120, respectively, in which a first and a second insulator in the form of a first and a second circumferential, electrically insulating strip 122 and 124, respectively, made of PEEK are arranged. The first cathode frame 106 and the first anode frame 114 are screwed on the first strip 122 each from one side in such a manner that a gap 126 is provided between the cathode frame 106 and the anode frame 114, and there is no electrical contact between these frames 106, 114. A gap 128 is formed in a similar manner between the second cathode frame 108 and the second anode frame 116. Unlike the embodiments shown in FIGS. 1a-1b and 2a-2b, the insulating space in the form of the gap 126, 128 between the cathode frame 106, 108 and the anode frame 114, 116 is not provided by the glue thread 110, 112, but by the electrically insulating strip 122, 124. It is easier to shape the strip 122, 124 than the glue thread 110, 112 into close tolerance, which means that the distance between the cathode 102, 104 and the flat side 46, 52 of the copper laminate 42 will be precise and equal over the entire surface of the copper laminate 42.

The cathode 102, cathode frame 106, the insulator 110, the strip 122 and the anode frame 114 form a first part 130, whereas the cathode 104, the cathode frame 108, the insulator 112, the strip 124 and the anode frame 116 form a second part 132. The parts 130, 132 are joined together in the lower portion of the cassette 100, as seen in FIG. 3d, by means of hinges 134, 136, which are made of an electrically insulating material, such as PEEK. The hinges 134, 136 can also be made of the same material, for example acid proof steel, as the rest of the cathode frames 106, 108, and if different voltage is to be applied to the cathodes 102, 104, the hinges are suitably insulated from the cathode frames.

Figure 3A:
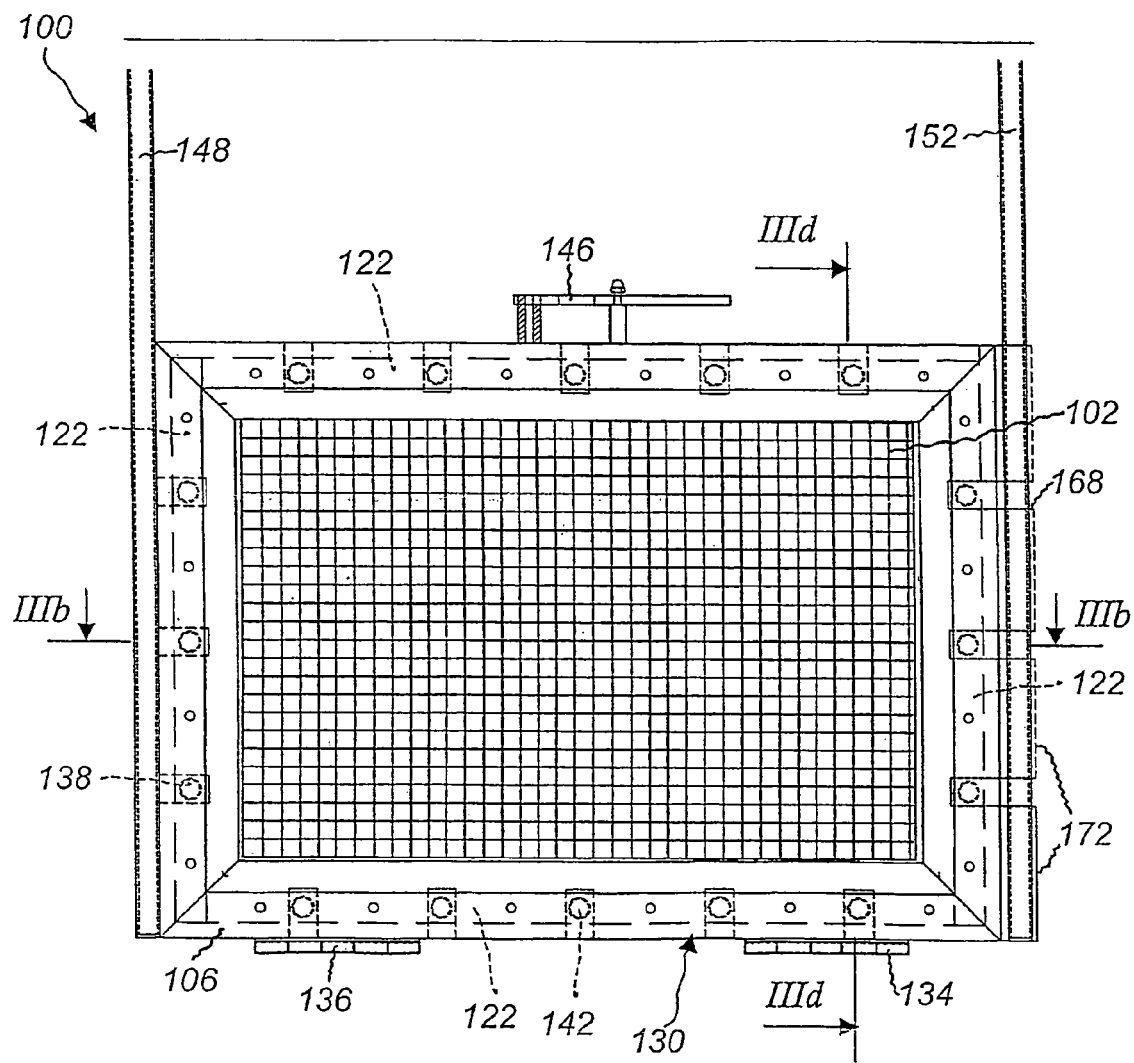
FIG. 3a is a side view showing another embodiment of a cassette for etching both flat sides of a copper laminate.
Figure 3C:
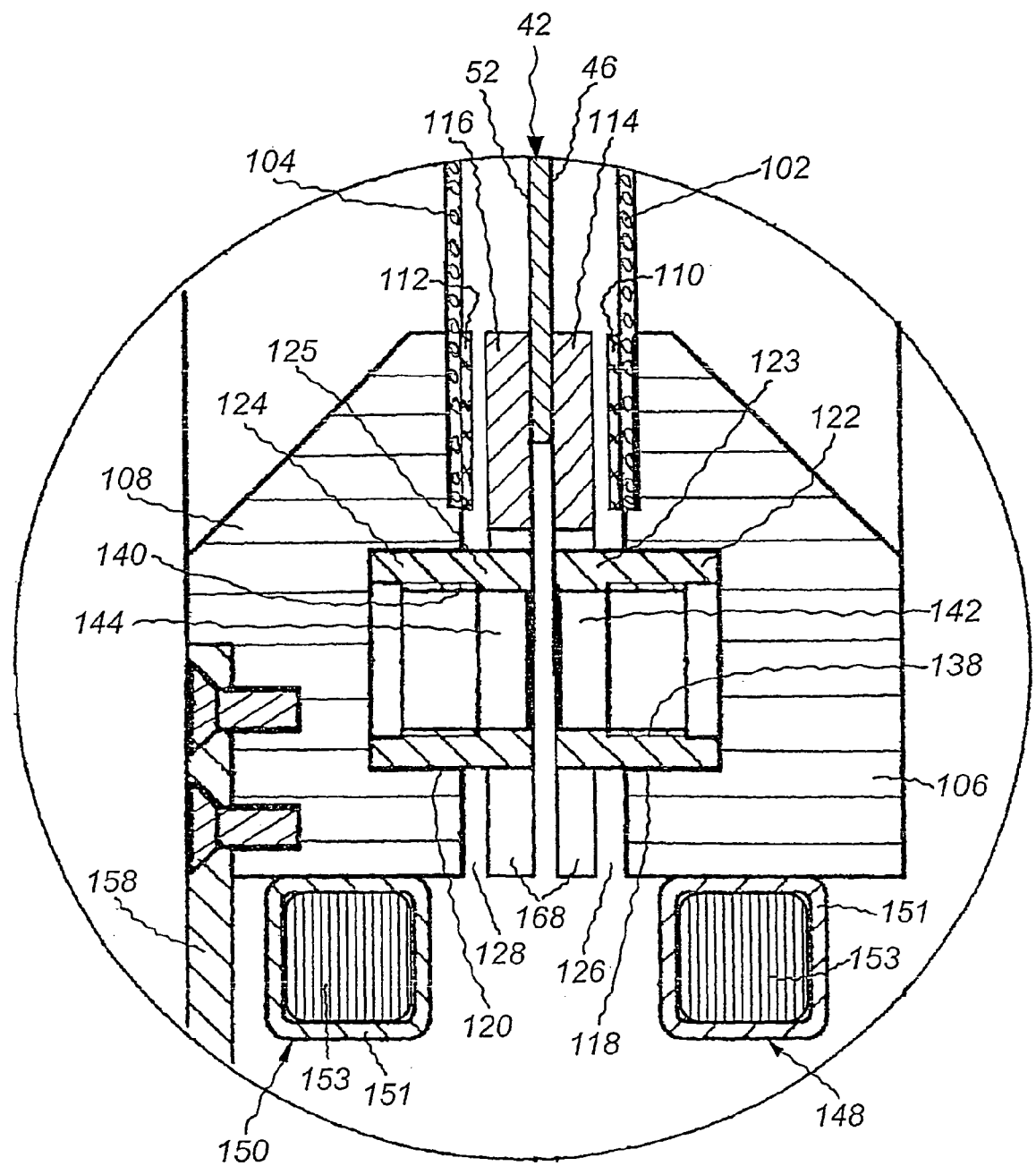
FIG. 3c shows the area IIIc in FIG. 3b on a larger scale.

Each strip 122, 124 is provided with a plurality of circular holes 138, 140. Neodym magnets 142, 144, which are also called NdFeB, are inserted into the holes 138, 140. The magnets 142 in the strip 122 attract the magnets 144 in the strip 124 without getting into contact with them, the first part 130 being able to be joined with the second part 132 without any electrical contact arising between the first and the second part 130 and 132, respectively. A handle 146 located in an upper portion of the cassette 100, as seen in FIG. 3a, is used to separate the first part 130 from the second part 132 and to open the cassette 100, when the copper laminate 42 is to be removed from the cassette 100. FIG. 3d shows the cassette 100 in an open position. FIGS. 3b and 3c show the cassette 100 in a closed position with an inserted copper laminate 42.

A voltage generator (not shown) supplies a first cathode line 148 and a second cathode line 150 with negative voltage, and a first anode line 152 and a second anode line 154 with positive voltage. The cathode lines 148, 150 provide the respective cathode frames 106, 108, and thus the respective cathodes 102, 104, with negative voltage. The anode lines 152, 154 provide the respective anode frames 114, 116, and thus the respective copper layers 48, 54 of the copper laminate 42, with positive voltage.

Both the cathode lines 148, 150 and the anode lines 152, 154 are made of hollow, square sectional elements 151 made of acid proof steel and provided with an inner core 153 of copper to obtain sufficient conductivity. The square sectional elements 151, which thus protect the respective copper cores 153 from being etched, are welded to the cathode frames and the anode frames, respectively, to provide good electrical contact. The second cathode frame 108 is provided with a first and a second guiding means 156, 158. The guiding means 156, 158 are slidably mounted in vertical slides 160, 162, which allows the cassette to be easily moved out of and into an electrolyte bath.

Figure 3E:
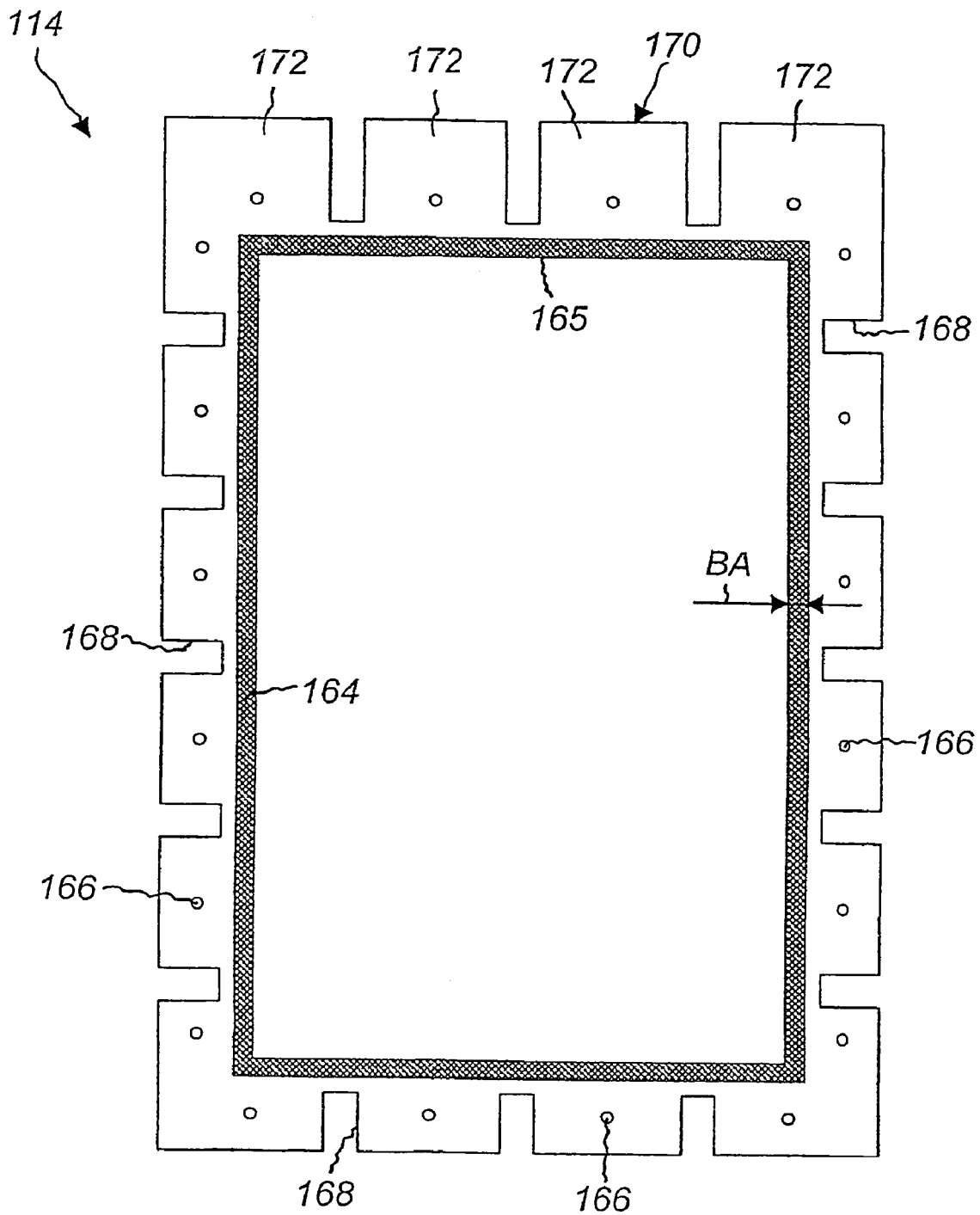

The anode frames 114 and 116 have at one side, as shown in FIG. 3e with reference to the anode frame 114, a grooved portion 164 extending along the inner edge of the anode frame. The grooved portion 164, which has a width BA of about 10 mm, is intended to engage the copper layer 48, 54 of the copper laminate 42 in such a manner that the copper laminate 42 is securely fastened and that good electrical contact is obtained between the respective anode frames 114, 116 and the respective copper layers 48, 54 along the entire periphery of the copper laminate 42. Owing to the firm fixture of the copper laminate 42 between the anode frames 114, 116 along the entire periphery, also large copper laminates 42 and copper laminates 42 with low rigidity can be etched at distances H1, H2 that are very small yet constant over the entire first and second flat sides 46 and 52, respectively, of the copper laminate 42. As shown in connection with the anode frame 114 in FIG. 3e, the anode frames 114 and 116 also have a plurality of screw holes 166, which are intended for screwing the anode frame 114 and 116, respectively, to the electrically insulating strip 122 and 124, respectively. The anode frames 114 and 116 also have a plurality of recesses 168, which enable the magnets 142 and 144, respectively, holding the parts 130, 132 together to get so close to each other that the parts 130 and 132 are kept well-together. The strip 122, 124, which is otherwise flat, thus has projections 123 and 125, respectively, provided with holes 138 and 140, respectively, in places corresponding to the recesses 168, as shown in FIG. 3c. At one end 170, each anode frame 114 and 116 has a plurality of connecting flanges 172, to which the anode line 152 and 154, respectively, is to be welded.

It is often suitable to produce a plurality of anode frames 114, 116, according to FIG. 3e, of sheet steel with different thickness. As an example, anode frames 114, 116 with a thickness of 2, 5, 7 and 10 mm can be made. By means of a set of such anode frames the distances H1, H2, in a given cassette 100, can easily be changed by screwing an anode frame 114, 116 of suitable thickness to the respective strips 122, 124. The opening 165 of the anode frame 114, 116 corresponds to the portion of the copper laminate 42 that is to be etched. By manufacturing anode frames with a smaller opening 165, also copper laminates with a smaller flat side can be etched in the cassette 100.

The cathode 12, 58, 66, 102, 104 is made of electrically conductive metal netting, which is preferably made of acid-proof steel. The netting is suitably made of metal threads with a diameter of about 300-1000 μm, which have been woven together into netting, preferably in a square pattern. If just a few or thin threads are used, the resistance in the netting increases, which results in generation of heat and reduction of the current that can be passed in the netting. If too thick threads are used, the electrolyte flow through the netting decreases. The openings 13, 59 in the form of meshes formed between the threads should be about 0.3-2 mm in a square. In case of too small openings, the netting risks getting clogged at the same time as the electrolyte flow through the netting decreases. In case of too large openings, the number of threads is reduced, which increases the resistance. This also makes the etching of the copper layer 8, 48, 54 more uneven, the etching usually being more powerful under the actual threads.

Figure 4A:
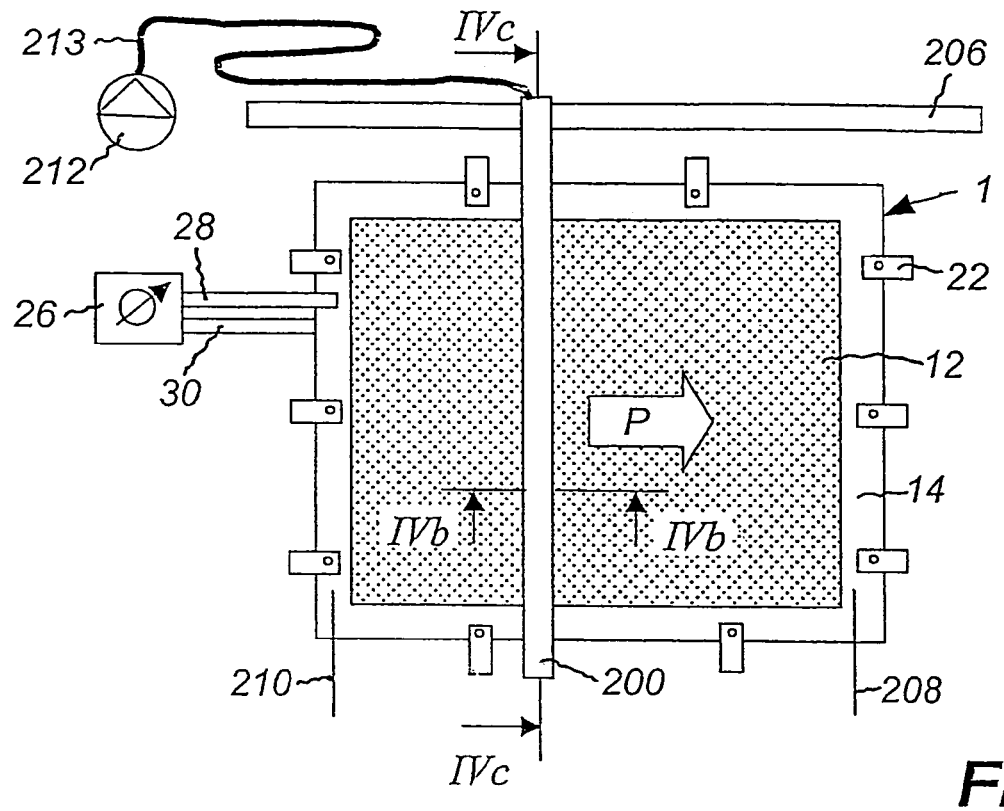
FIG. 4a shows a flow-generating pipe, which has a nozzle and which is moved over a flat side of a cathode.
Figure 4B:
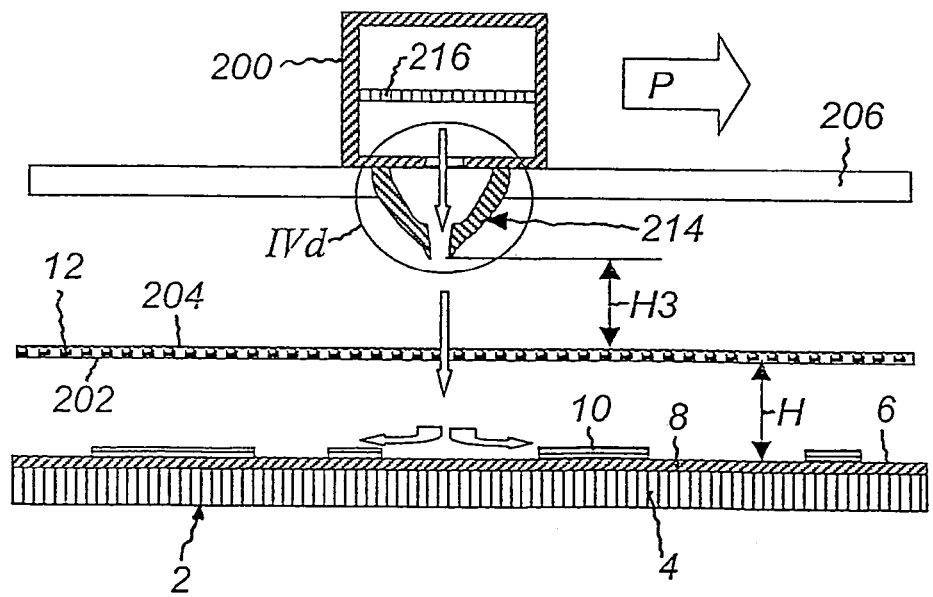
FIG. 4b shows the pipe in FIG. 4a along the line IVb-IVb.

FIGS. 4a-4d show a first embodiment of a flow-generating means in the form of a pipe 200. As seen in FIG. 4b, the cathode 12 which is formed as netting has a first flat side 202 facing the copper laminate 2 and a second flat side 204 facing away from the copper laminate 2. The pipe 200, which is a hollow, square sectional element, is attached to a displacing means in the form of a rail 206, which is arranged to move the pipe 200 along the second flat side 204 of the cathode 12 in the direction of the arrow P. When the pipe reaches a first end position 208, the rail 206 changes the direction of movement and moves the pipe 200 in the opposite direction towards a second end position 210. A pump 212 is arranged to supply the pipe 200 with electrolyte by means of a flexible hose 213 during the entire movement. It is important for the movement of the pipe 200 to take place at a regular speed over the entire copper laminate 2 or at least over the portions of the copper laminate 2 which are sensitive to uneven etching. For this reason, the end positions 208, 210 are located immediately outside the cathode 12 so that the pipe 200 will have time to reach full and regular speed after turning before the pipe 200 passes over the sensitive portions of the copper laminate 2. The electrolyte flow supplied by the pump 212 to the pipe 200 is passed through a nozzle 214 towards the second flat side 204 of the cathode 12, passed through the cathode 12 and flushed over the flat side 6 of the copper laminate 2, as shown by arrows in FIG. 4b, whereby even and efficient etching is achieved. The nozzle 214 ends at a distance H3 of about 10 mm from the second flat side 204 of the cathode 12.

Figure 4C:
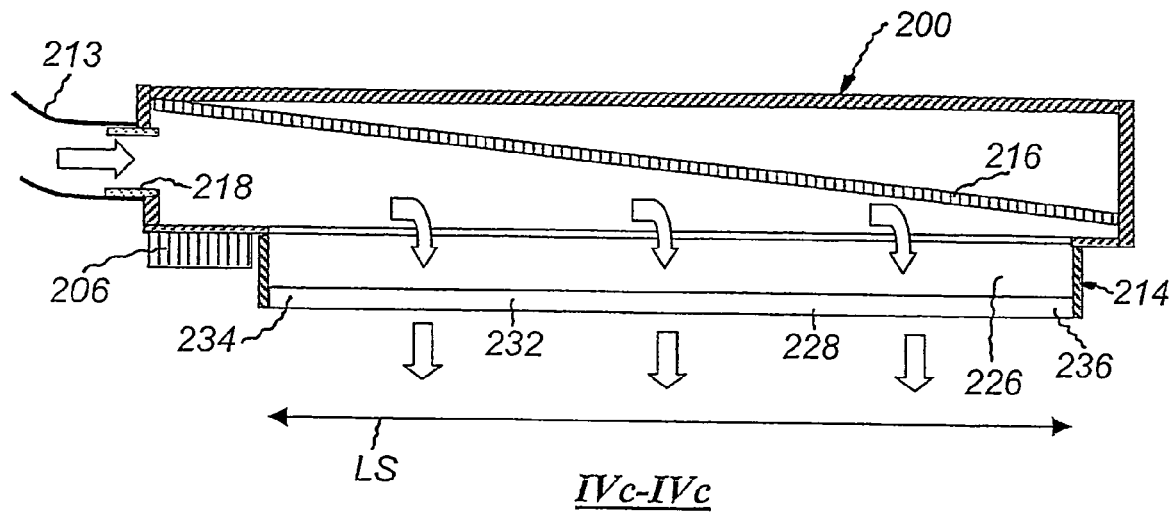
FIG. 4c shows the pipe in FIG. 4a along the line IVc-IVc.

It is important for the electrolyte flow to be even along the length of the pipe 200. This is why a flow-restricting plate 216 is arranged in the pipe 200, as shown in FIGS. 4b and 4c. The flow-restricting plate 216 decreases the cross-section of the pipe 200 along its length, seen from an inlet 218 for the electrolyte flow. As shown by arrows in FIG. 4c, the electrolyte flow is introduced through the inlet 218 and leaves the nozzle 214 in the form of an even electrolyte flow.

Figure 4D:
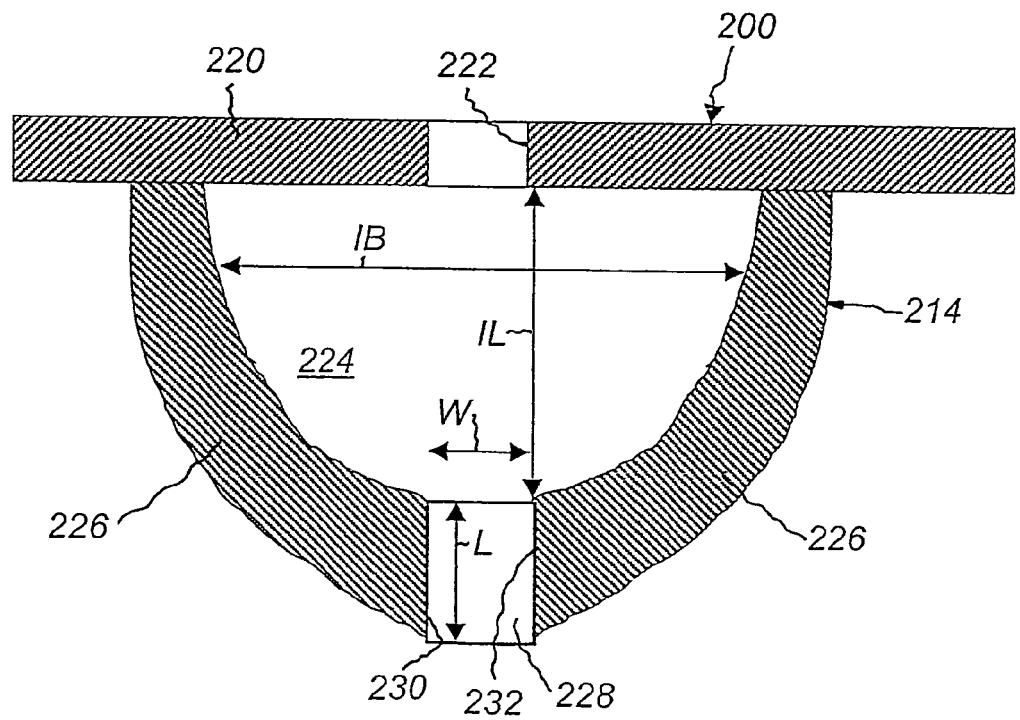
FIG. 4d shows the area IVd in FIG. 4b on a larger scale.

The cathode 12, the copper laminate 2 and the pipe 200 are all immersed in the electrolyte. To provide an electrolyte flow, which can be passed through the electrolyte and the cathode 12 towards a flat side 6 of the copper laminate 2, it is, under these circumstances, necessary for the electrolyte flow leaving the nozzle 214 to be substantially laminar. FIG. 4d, which shows the area IVd in FIG. 4b on a larger scale, shows a way of providing such a laminar electrolyte flow. In one wall 220 of the pipe 200, a first opening is provided in the form of a first gap 222 extending along the pipe. The gap 222, which has a width of 1.5 mm, ends in an antechamber 224, which is formed of a longitudinal casing 226 and has an inner width IB of about 20 mm and an inner IL of about 30 mm. The casing 226 has a second opening in the form of a second gap 228, which is located just opposite the opening 222. The second gap 228 has a first and a second wall 230 and 232, respectively. The walls 230, 232 are completely parallel to each other and have a length L of 5 mm. The distance between the walls 230, 232, i.e. the width W of the gap 228, is 1.5 mm. The extension LS of the second gap 228 along the pipe 200 is suitably greater than the width of the copper laminate 42 over which the pipe 200 is displaced. This is because the flow closest to the end portions 234 and 236 of the gap 228 is not even enough to obtain good etching of the copper laminate 42.

Figure 4E:
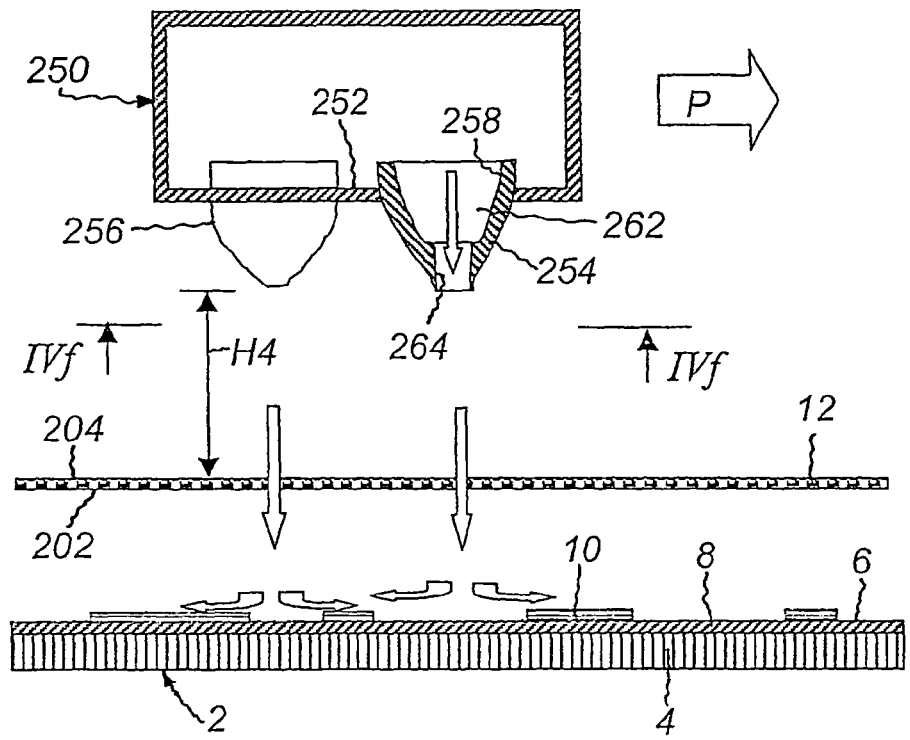
FIG. 4e is a cross-sectional view showing an alternative embodiment of a pipe, which is provided, in its side facing the cathode, with a plurality of nozzles in the form of circular holes.
Figure 4F:
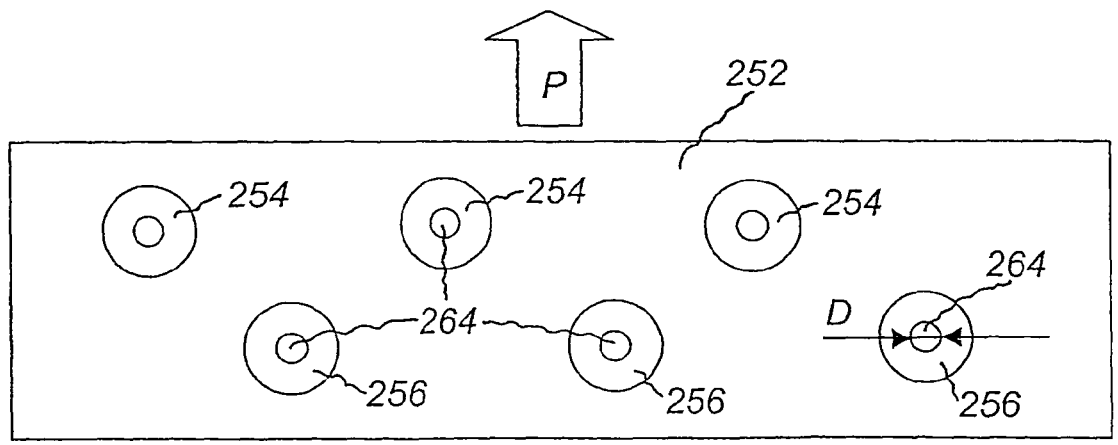
FIG. 4f shows the pipe illustrated in FIG. 4e, seen in the direction of the arrow IVf.

FIGS. 4e-4f show an alternative embodiment of the pipe 200 shown in FIGS. 4a-d in the form of a pipe 250. The pipe 250 has a device for moving the pipe 250 (not shown in FIG. 4e of the same type as the rail 206 shown in FIG. 4a. The pipe 250 has a first row of nozzles 254 and a second row of nozzles 256 in the wall 252 located closest to the cathode. The pressure drop in the nozzles 254, 256 makes it unnecessary to provide a flow-restricting plate to obtain an even electrolyte pressure along the pipe 250 in the embodiment shown in FIGS. 4e-f.

The nozzles 254 in the first row and the nozzles 256 in the second row are in staggered relationship transversely to the direction of movement P of the pipe 250 such that a flat side 6 of the copper laminate 2 is well covered during the reciprocating motion of the pipe. 250 over the second flat side 204 of the cathode 12. The nozzles 254 and 256 are circular and their openings are located at a distance H4 of 10 mm from the second flat side 204 of the cathode 12. Each nozzle 254, 256 has a first opening in the form of a circular inlet hole 258, which has a diameter of 12 mm, an antechamber 262 and a second opening in the form of a circular hole 264 formed in the wall of the antechamber 262 closest to the cathode 12. Each of the circular holes 264 has the form of a straight, circular cylinder with a diameter of 3 mm and a length of 5 mm and has been formed in a manner similar to that described above in connection with the second gap 228 of the pipe 200. The circular nozzles 254, 256 provide a good electrolyte flow along the flat side 6 of the copper laminate 2, since the jet, which has a substantially laminar flow, will be spread from an individual nozzle 254, 256 in all directions when it hits the flat side 6 of the copper laminate 2.

Figure 5A:
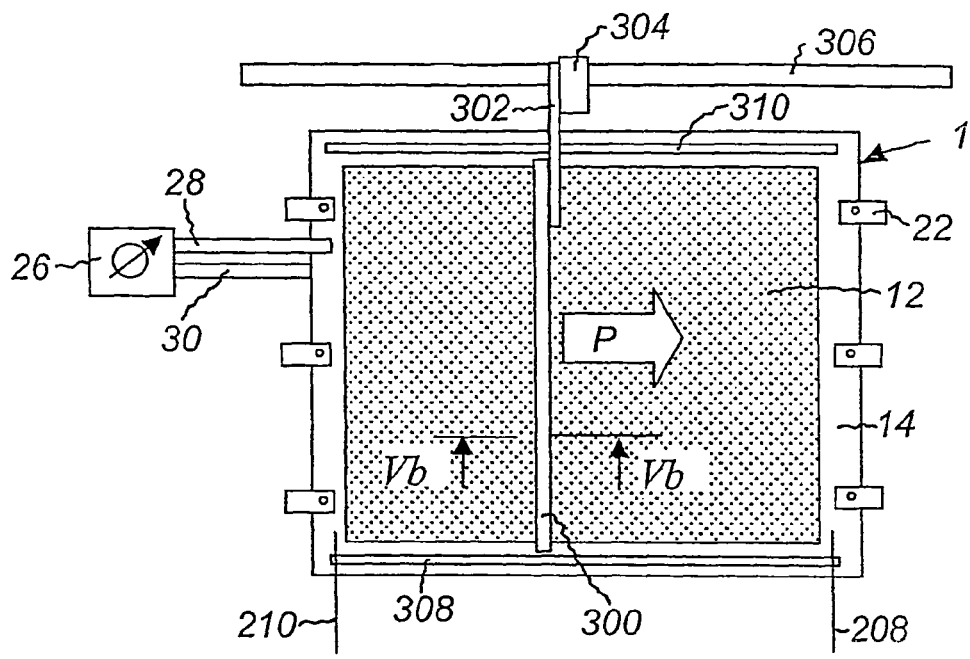
FIG. 5a shows a flow-generating means in the form of a bar which is moved over a flat side of cathode.
Figure 5B:
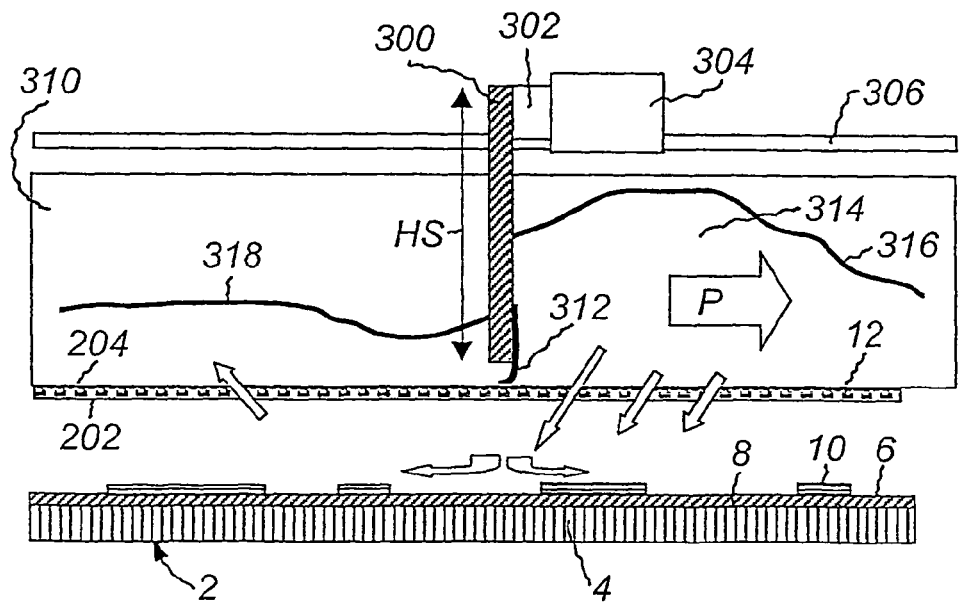
FIG. 5b shows the bar in FIG. 5a along the line Vb-Vb.

FIGS. 5a-5b show another embodiment of a flow-generating means in the form of a bar formed as a scraper 300. The scraper 300, which is a solid rectangular sectional element made of acid proof steel, is attached to a supporting arm 302 fixed on a driving motor 304. The motor 304 can be driven along a rail 306 and can thus move the scraper 300 over the cathode 12 between the end positions 208, 210 in the manner described above with reference to FIG. 4a-f. Two longitudinal wall plates 308 and 310 constitute walls surrounding the space in which the scraper 300 is moved. In its portion located closest to the cathode 12, the scraper 300 has a sealing strip 312 made of an electrically nonconductive material, such as rubber. The sealing strip 312 seals the space between the scraper 300 and the second flat side 204 of the cathode 12.

When the scraper is moved in the direction of the arrow P at a suitable speed, a pressure wave 314 forms before the scraper 300. Consequently, the liquid surface 316 immediately before the scraper 300 will be situated higher than the liquid surface 318 immediately behind the scraper 300. As a result, the pressure wave 314 will generate an electrolyte flow, illustrated by arrows in FIG. 5b, through the cathode 12 towards a flat side 6 of the copper laminate 2, yielding even and efficient etching. Behind the scraper 300, the electrolyte flow will flow back up through the cathode 12. The height HS of the scraper 300 is 100 mm. The cassette 1 is placed horizontally in an electrolyte bath. The cathode 12 is placed about 50 mm below the liquid surface formed by the electrolyte when the scraper 300 is not being moved. Depending on the desired speed of the motion of the scraper 300 and the desired electrolyte flow through the cathode 12, the height HS of the scraper 300 can be selected in the range of about 20-250 mm, the cathode 12 being placed at a suitable distance below said liquid surface of the electrolyte, for example about 10-150 mm below the same.

The above-described scraper 300 can also be used when both the cassette 1 and the scraper 300 are completely immersed in the electrolyte, such as when the cassette 1 is placed vertically in an electrolyte bath.

In such a case, a covering plate (not shown) has to be used, which is parallel to and substantially covers the cathode 12 and which is arranged at the other side, relative to the cathode, of the supporting arm 302 in the vicinity thereof, in order to generate the surface effect created by the liquid surface 316 in the embodiment described above.

Figure 6:
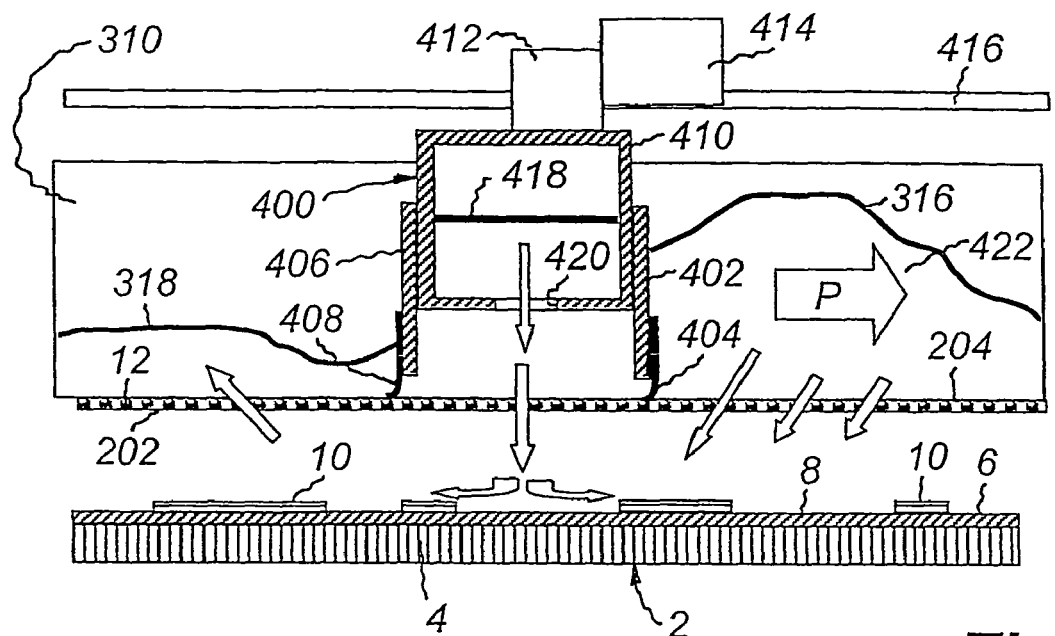
FIG. 6 shows an alternative embodiment of a bar.

FIG. 6 shows yet another embodiment of a flow-generating means in the form of a double scraper 400. The scraper 400 has a first blade 402 provided with a first rubber moulding 404 and a second blade 406 provided with a second rubber moulding 408. The blades 402, 406 are fixed on two opposite sides of a pipe 410. A supporting arm 412 is attached to the pipe 410. The supporting arm 412 is in turn attached to a combined pumping and driving unit 414 arranged on a rail 416. The unit 414 is arranged to move the scraper 400 reciprocatingly over the second flat side 204 of the cathode 12 and to pump an electrolyte flow into the pipe 410. The pipe 410 is equipped with a flow-restricting plate 418 to provide an even electrolyte pressure along the pipe 410. The pipe 410 has a longitudinal gap 420, out of which the electrolyte flows down through the cathode 12. When moving in the direction of the arrow P, the double scraper 400 generates a pressure wave 422 before itself in a manner similar to that described above with reference to FIGS. 5a-b. The pressure wave 422 generates a flow (in FIG. 6 illustrated by arrows directed obliquely downward) through the cathode 12 and towards a flat side 6 of the copper laminate 2. The scraper 400 also generates a substantially laminar electrolyte flow, which leaves the pipe 410 through the gap 420 and is passed through the cathode 12 towards the flat side 6 of the copper laminate 2. The combination of the effects described with reference to FIGS. 5a-b and FIGS. 4a-f results in the double scraper 400 generating excellent stirring of the electrolyte at the flat side 6 of the copper laminate 2.

Figure 7:
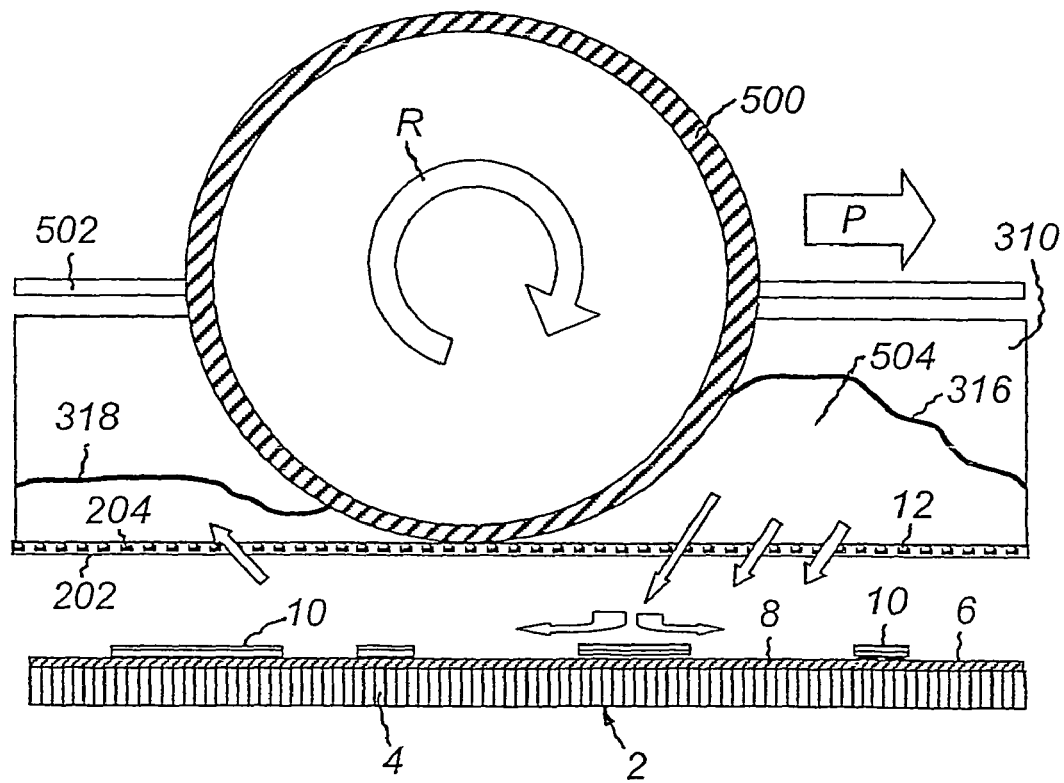
FIG. 7 shows another alternative embodiment of a bar.

FIG. 7 shows a further embodiment of a flow-generating means in the form of a roller 500. The roller 500 is arranged to be rolled over the second flat side 204 of a cathode 12. A rail 502 is arranged to move the roller 500 over the second flat side 204 of the cathode 12 under rotation, as shown by an arrow R. When quickly moving the roller 500 over the cathode 12 in the direction of the arrow P, a pressure wave 504 is generated before the roller 500. The pressure wave 504 generates an electrolyte flow (in FIG. 7 represented by arrows directed obliquely downward) through the cathode 12 and towards a flat side 6 of the copper laminate 2. The roller 500 is suitably made of an electrically insulating material, such as PEEK or polypropylene.

It will be understood that the flow-generating means shown in FIGS. 4-7 can also be used when a copper laminate 42 is to be etched simultaneously on both flat sides 46, 52, such as is the case, for example, with the cassettes 40 and 100, respectively. In this case, a first flow-generating means 200, 250, 300, 400, 500 is arranged at a second flat side of the first cathode 58, 102 facing away from the copper laminate 42, The first and second flow-generating means 200, 250, 300, 400, 500 is arranged at a second flat side of a second cathode 66, 104 facing away from the copper laminate 42. The first and the second flow-generating means can then be moved synchronously or independently of each other.

The flow-generating means 200, 250, 300, 400, 500 is suitably electrically insulated from the cathode 12, 58, 102. This insulation can, as already described, either consist in the flow-generating means 200, 250 being located at a distance from the cathode or in a part of the flow-generating means 300, 400, 500 that is in contact with the cathode 12, 58, 102 being made of an electrically insulating material.

In case of very large copper laminates, several separate flow-generating means can be moved over the same cathode 12, 58, 102 to provide good coverage of the copper laminate without necessitating too high a speed of the motion of the flow-generating means.

It has already been described how the cassette 1, 40, 100 is kept stationary while the flow-generating means 200, 250, 300, 400, 500 is moved over the respective cathodes 12, 58, 66, 102, 104. It is also possible to move simultaneously both the cassette 1, 40, 100 and the flow-generating means 200, 250, 300, 400, 500, or to move the cassette 1, 40, 100 and keep the flow-generating means 200, 250, 300, 400, 500 stationary. The latter alternatives can be used in a continuous process, in which the cassette 1, 40, 100 is moved through a number of processing steps by a conveyor. The cassette 1, 40, 100 can be moved either horizontally, i.e. in a lying position, or vertically, i.e. in an upright position.

The flow-generating means 200, 250, 300, 400, 500 is suitably moved relative to the cathode 12, 58, 66, 102, 104 in the direction of the arrow P at a speed of 0.01-1 m/s, preferably about 0.02-0.5 m/s.

To ensure a substantially laminar flow out of the nozzle 214, 254, 256, the length L of the second opening 228, 264 should be greater than the width W, D. The width W and the diameter D of the second opening 228, 264 should be 0.4-10 mm, preferably 0.8-5 mm. The flow velocity in the second opening 228, 264 should then be about 2-25 m/s, preferably 7-14 m/s.

The electrolyte flow supplied to the pipe 200, 250 should correspond to a total electrolyte flow of 5-500 $l/(s*m^2)$, preferably 15-200 $l/(s*m^2)$. When, for example, the pump 212 is pumping an electrolyte flow of 8 l/s to the pipe 200 and a first flat side 6 of the copper laminate 2 has an area of 0.45 m×0.30 m=0.135 $m^2$, a total electrolyte flow of 8/0.135=59 $l/(s*m^2)$ is obtained. Locally under the nozzle 214, the electrolyte flow will, of course, be considerably higher.

The distance H between the copper layer 8 of the copper laminate 2 and a first flat side 202 of the cathode 12 is suitably 100 mm at most. When etching copper laminates 42 with thin electric conductors, i.e. when the electric conductors that remain under the resist layer 10 after the surrounding portions of the copper layer 8 have been etched away have a width of about 200 µm or less, the distance H should be about 20 mm at most, preferably about 10 mm at most (the same applies to the distances H1 and H2 in double-side etching). When etching copper laminates 42 with electric conductors having a width of about 50 µm and less, even smaller distances H, H1, H2, for example, of about 5 mm and less, may be applicable. The distance H3, H4 from the opening 228, 264 of the nozzle 214, 254, 256 to the second flat side 204 of the cathode 12 is suitably about 50 mm at most, preferably about 25 mm at most, and more preferably. about 5-15 mm.

Figure 8:
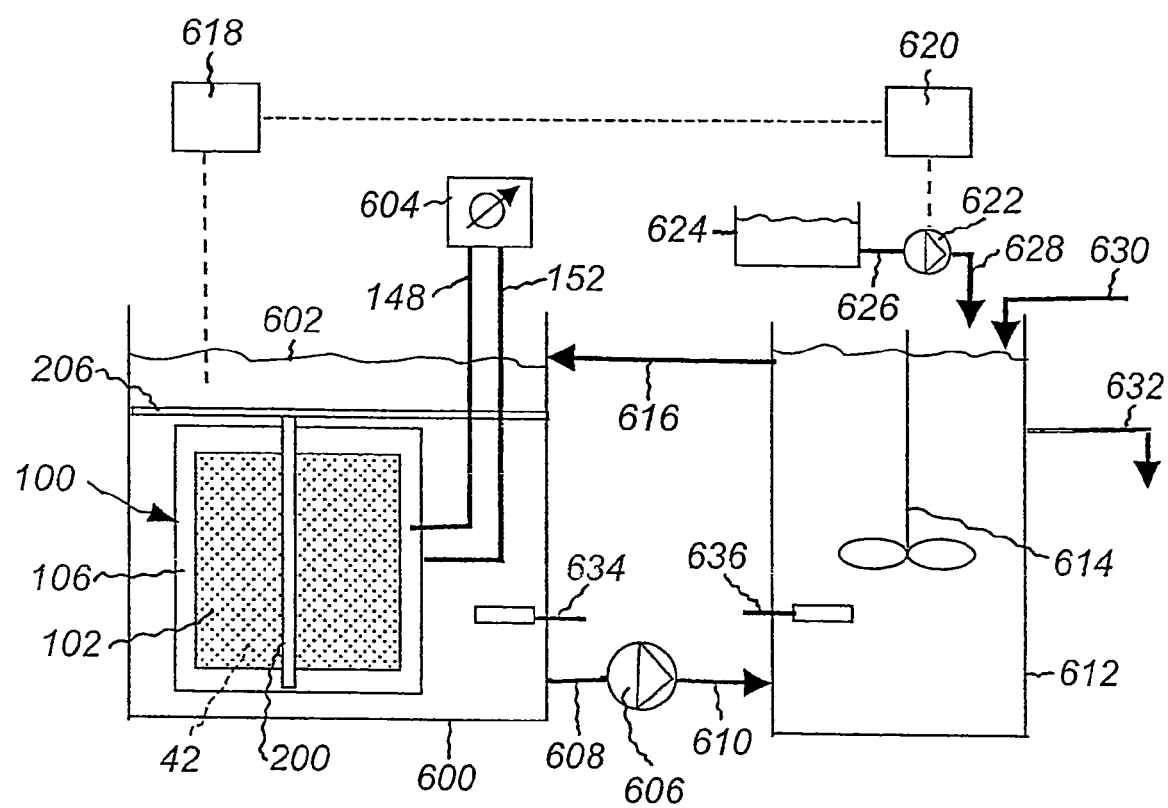
FIG. 8 schematically shows a device for etching copper laminate.

FIG. 8 schematically shows a device for etching of a copper laminate 42. The copper laminate 42 is fixed in a cassette 100 of the above-described kind. A first pipe 200 of the above-described kind is reciprocatingly moved by means of a rail 206 over the first cathode 102 and generates an electrolyte flow through the cathode 102. A second pipe (not shown in FIG. 8) generates in a corresponding manner an electrolyte flow through the cathode 104. The cassette 100 and the pipe 200 are placed in an etching tank 600 and located below the liquid surface 602 of the electrolyte. A voltage generator 604 supplies negative voltage through cathode lines 148 to the cathode frames 106 of the cassette 100 and positive voltage through anode lines 152 to the anode frames of the cassette 100. A pump 606 pumps electrolyte through liquid conduits 608, 610 to a regeneration tank 612. The regeneration tank 612, which is equipped with an agitator 614, is used to regenerate the electrolyte so as to maintain the etching capacity of the device. An overflow pipe 616 conducts regenerated electrolyte back to the etching tank 600.

As seen in FIG. 8 a measuring device 618 is arranged to measure the etching capacity of the electrolyte. The measuring device 618 can be intended for either manual or automatic measuring. The measuring device 618 can, for example, analyse the content of an etching compound in the electrolyte. The measuring device 618 transmits a signal to a dosing device 620. The dosing device 620 controls the amount of regeneration chemicals which is to be pumped by a pump 622 to the regeneration tank 612 from a dosing tank 624 through conduits 626, 628. The regeneration tank 612 also has a conduit 630 for feeding water and additives, if any, to the electrolyte and a conduit 632 for evacuating electrolyte to avoid accumulation of undesirable substances in the electrolyte. Both the etching tank 600 and the regeneration tank 612 are equipped with an electric heater 634 and 636, respectively, to provide the desired etching temperature.

It will be understood that a number of modifications of the embodiments described above are conceivable within the scope of the invention.

Thus, the cathode 12, 58, 66, 102, 104 can be designed in many different ways. Besides various types of netting and metal fabric, also perforated plates and bars, which are placed at a distance from each other, can be used as a cathode. The important thing is that the cathode has good electric conductivity and good permeability to the electrolyte flow while allowing etching without any undesirable patterns being generated on the board for electric reasons.

To obtain increased durability against the electrolyte, the cathode can suitably be plated with a precious metal, for example gold. Correspondingly, the parts of the cassette which do not need to have good conductivity can be protected against the electrolyte, for example by a chromium oxide coating or an epoxy coating.

The flow-generating means 200, 250, 300, 400, 500 can be moved relative to the cathode 12, 58, 102 in various motions, such as rotating, oscillating and sweeping in a curved motion, such as a circular motion. However, the reciprocating motion described above and the sweeping motion, which is to be considered as a kind of reciprocating motion, yield an optimal etching result. The displacing means can, for example, comprise a splined shaft, a stepping motor or a conveyor belt or chain with a variable direction of movement. The distance H3, H4 can suitably be 0.5-10 cm.

The insulators 16, 62, 70, 122, 124 can be made of a number of different electrically insulating materials. Use can, for example, be made of epoxy adhesive, teflon and PEEK. The important thing is that the insulator should have a precise and well-defined thickness to make the distance H, H1 and H2 precise over the entire flat sides 6, 46, 52 of the board 2, 42. The anode frames 18, 64, 72, 114, 116 also have to have a precise and well-defined thickness. Furthermore, distances H, H1, H2 of 10 mm and less require the anode frames to be made very thin. The electric insulator should be arranged to keep the anode frame at a very short distance from the cathode and the cathode frame, but not at such a short distance as to provoke a short circuit. With the above-mentioned short distances H, H1, H2, high demands have to be placed on the flatness of the anode frames, cathode frames, the cathodes and the insulators. However, the divisible cassette 1, 40, 100 allows efficient etching of boards 2, 42 also when applying these short distances H, H1, H2. In particular the cassette 100, which has two parts 130, 132, each of said parts comprising a cathode 102, 104, a cathode frame 106, 108, an insulator 110, 112, and an anode frame 114, 116, which are attached to each other, and said parts being interconnected by means of hinges 134, 136, is very efficient in these cases.

The flow-generating means 200, 250, 300, 400, 500 can also be used if the cathode and the board are not attached to each other, such as in continuous processes, in which boards are conveyed under cathodes for example on rollers, which contact the board which then becomes an anode. The flow-generating means can be fixed or movable and generate an electrolyte flow through the cathode towards the board. However, the above-described cassettes 1, 40, 100 are those that are most advantageous.

The cassette 1, 40, 100 can also comprise a solid cathode, which for example is made of a non-perforated metal sheet. In such a cassette, there is either no exchange of electrolyte whatsoever during etching, or an electrolyte flow is provided through holes in the sides of the cathode frame/frames, the electrolyte flow being passed along the surface of the board. It is, however, most advantageous for the cathodes to be perforated by openings, as described above.

Also layers of metal other than copper can be etched using the above-described methods and devices. Examples of such metal layers are chromium and nickel layers. The invention is, however, particularly convenient in the etching of thin copper layers. The thickness of the electrically conductive layer can be about 0.1 µm to about 1000 µm. When etching copper layers, the thickness of the layer is usually about 5-35 µm.

The substantially laminar electrolyte flow through the cathode is suitably directed perpendicularly to the flat-side of the board. It is, however, also conceivable in some applications, where appropriate, to use a pipe with nozzles directing the electrolyte flow at a different angle to the flat side of the board. When using at least two rows of circular nozzles 254, 256, the nozzles in the two rows can, for example, be directed in different directions, which provides a conical spray pattern under the pipe.

The cassette 1, 40, 100 can be kept together with the aid of various means. Besides the above-mentioned magnets and clamps, use can be made of insulating bolts, insulating fasteners, etc. If, for example, an electrically insulating supporting frame 20 is used, or if two cathodes 58, 66 are to be connected to the same voltage source, also electrically conductive, clamping means, such as steel clamps, can be used to keep the cassette pressed together, provided that these means do not get into contact with the anode frames or the board.

As mentioned above, the cassette 1, 40, 100 can be used in both a vertical and a horizontal position and, naturally, at any angle therebetween. The cassette 1, 40, 100 can also be used in batchwise methods, as described above reference to FIG. 8, and in continuous methods. In a continuous method, the cassette is conveyed between different processing stations by a conveyor, which may for example comprise rollers, endless belts or guides.

The invention claimed is:

1. A method of etching copper on boards, comprising:
applying an electric voltage between a cathode and a board, which constitutes an anode, the cathode and the board being immersed in an electrolyte,
wherein:
the electrolyte comprises at least a first component, which can be reduced from a first state in the form of an ion comprising a metal atom with a first positive oxidation number, to a second state in the form of an ion comprising the metal atom with a second positive oxidation number, the second positive oxidation number being smaller than the first positive oxidation number;
the electrolyte includes a first redox potential for reducing the first component from the first state to the second state and a second redox potential for reduction of divalent copper ions to metallic copper, the first redox potential being greater than the second redox potential; and
metallic copper on the board is oxidized and converted into positively charged copper ions while the first component is reduced from its first state to its second state, wherein precipitation of the copper ions on the cathode does not occur.

2. The method as claimed in claim 1, wherein the first component is selected from the group consisting of Fe, Mn, Ce and inorganic and organic complexes thereof.

3. The method as claimed in claim 2, wherein the first component is Fe, which is added to the electrolyte in the form of $Fe^{3+}$ or a precursor thereof.

4. The method as claimed in claim 1, wherein the capacity of the electrolyte to etch the copper on the board, in the absence of an applied voltage, corresponds to an etching rate of 6-100 nm/s.

5. The method as claimed in claim 1, wherein the electrolyte further comprises a second component that can be reduced from a first state in the form of an ion having an atom with a first positive oxidation number, to a second state in the form of an ion comprising said atom with a second positive oxidation number, which is smaller than said first positive oxidation number of the second component, and
   a third redox potential in the electrolyte for reduction of the second component from its first state to its second state being lower than the second redox potential in the electrolyte for reduction of divalent copper ions to metallic copper.

6. The method as claimed in claim 5, wherein the second component is Sn.

7. The method as claimed in claim 1 or claim 5, wherein the electrolyte further comprises fluoride ions, $F^-$ in a concentration of 0.01-0.5 mol/l.

8. The method as claimed in claim 1 or claim 5, wherein the electrolyte further comprises chloride ions, $Cl^-$, in a concentration of 0.03-1.5 mol/l.

9. The method as claimed in claim 1, wherein the voltage applied is 0.5-6 V.

10. The method as claimed in claim 1, wherein the concentration of the first component is 0.02-0.7 mol/l.

11. The method as claimed in claim 1, wherein at least two different first components are added to the electrolyte.

12. The method as claimed in claim 1, wherein the pH of the electrolyte is −0.5 to 4.0.

13. The method as claimed in claim 1 or claim 5, wherein the electrolyte is treated with a regenerant chosen from strong oxidizing agents for converting the first component from its second state to its first state.

14. The method as claimed in claim 1 or claim 5, wherein a fourth redox potential in the electrolyte for reduction of said second state of the first component to a third state is lower than the redox potential of hydrogen gas.

15. The method as claimed in claim 6, wherein the Sn is present in the electrolyte in a concentration of 0.005-0.4 mol/l.

16. The method as claimed in claim 15, wherein the electrolyte further comprises fluoride ions, $F^-$, in a concentration of 0.01-0.5 mol/l.

17. The method as claimed in claim 13, wherein the regenerant comprises $Na_2S_2O_8$.

\* \* \* \* \*